(12) United States Patent
Uchida et al.

(10) Patent No.: US 8,168,001 B2
(45) Date of Patent: May 1, 2012

(54) FILM-FORMING APPARATUS AND FILM-FORMING METHOD

(75) Inventors: Hiroto Uchida, Kanagawa-ken (JP);
Takehito Jinbo, Shizuoka-ken (JP);
Takeshi Masuda, Shizuoka-ken (JP);
Masahiko Kajinuma, Shizuoka-ken (JP); Takakazu Yamada, Shizuoka-ken (JP); Masaki Uematsu, Shizuoka-ken (JP); Koukou Suu, Chiba-ken (JP); Isao Kimura, Shizuoka-ken (JP)

(73) Assignee: Ulvac, Inc., Kanagawa (JP)

( * ) Notice: Subject to any disclaimer, the term of this patent is extended or adjusted under 35 U.S.C. 154(b) by 484 days.

(21) Appl. No.: 10/417,139

(22) Filed: Apr. 17, 2003

(65) Prior Publication Data

US 2003/0198741 A1 Oct. 23, 2003

(30) Foreign Application Priority Data

Apr. 19, 2002 (JP) ................... 2002-117123
Aug. 23, 2002 (JP) ................... 2002-243507

(51) Int. Cl.
*C23C 16/00* (2006.01)
*C23C 16/455* (2006.01)
*H01L 21/306* (2006.01)

(52) U.S. Cl. ............... 118/715; 156/345.33; 156/345.34

(58) Field of Classification Search .................. 118/715; 156/345.33, 345.34
See application file for complete search history.

(56) References Cited

U.S. PATENT DOCUMENTS

| 4,765,146 A | * | 8/1988 | Hellat et al. | .................. 60/746 |
| 5,178,531 A | * | 1/1993 | Naito et al. | .................. 431/170 |
| 5,221,425 A | * | 6/1993 | Blanchard et al. | .............. 216/66 |
| 5,284,519 A | * | 2/1994 | Gadgil | .................. 118/719 |
| 5,470,390 A | * | 11/1995 | Nishikawa et al. | .................. 118/719 |
| 5,525,160 A | * | 6/1996 | Tanaka et al. | .................. 118/728 |
| 5,834,371 A | * | 11/1998 | Ameen et al. | .................. 438/656 |
| 5,914,001 A | * | 6/1999 | Hansen | .................. 156/345.27 |
| 5,954,911 A | * | 9/1999 | Bergman et al. | .................. 156/345.29 |
| 6,113,699 A | * | 9/2000 | Hansen | .................. 118/715 |
| 6,179,920 B1 | * | 1/2001 | Tarutani et al. | .................. 118/715 |
| 6,216,613 B1 | * | 4/2001 | Wachendorfer | .................. 110/347 |
| 6,312,526 B1 | * | 11/2001 | Yamamuka et al. | .................. 118/720 |
| 6,409,839 B1 | * | 6/2002 | Sun et al. | .................. 118/726 |
| 6,518,494 B1 | * | 2/2003 | Shibuya et al. | .................. 136/261 |
| 6,730,619 B2 | * | 5/2004 | Jung et al. | .................. 438/783 |

(Continued)

FOREIGN PATENT DOCUMENTS

JP 62-213127 * 9/1987

(Continued)

*Primary Examiner* — Jeffrie R Lund
(74) *Attorney, Agent, or Firm* — Arent Fox LLP

(57) ABSTRACT

Film-forming apparatus including a film-forming vacuum chamber having a stage for a substrate, a chamber for mixing gas comprising a raw gas and a reactive gas connected to the film-forming chamber, a chamber for vaporizing the raw material, and a gas head for introducing the mixed gas into the film-forming chamber, disposed on the upper face of the film-forming chamber and opposed to the stage. Particle traps with controllable temperatures are positioned between the vaporization chamber and the mixing chamber and on the downstream side of the mixing chamber. When forming a thin film with the apparatus, a reactive gas and/or a carrier gas are passed through the film-forming chamber while opening a valve in a by-pass line, connecting the primary side to the secondary side of the particle trap arranged at the downstream side of the mixing chamber. The valve is then closed and the film-forming operation is initiated.

15 Claims, 11 Drawing Sheets

U.S. PATENT DOCUMENTS

| | | | |
|---|---|---|---|
| 6,868,869 B2 * | 3/2005 | Olander | 137/888 |
| 6,933,010 B2 * | 8/2005 | Yamada et al. | 427/248.1 |
| 7,618,493 B2 * | 11/2009 | Yamada et al. | 118/715 |
| 2001/0039115 A1 * | 11/2001 | Tsuneda et al. | 438/650 |
| 2002/0179248 A1 * | 12/2002 | Kabansky | 156/345.36 |
| 2003/0019428 A1 * | 1/2003 | Ku et al. | 118/715 |
| 2003/0106581 A1 * | 6/2003 | Shibuya et al. | 136/260 |
| 2003/0198741 A1 * | 10/2003 | Uchida et al. | 427/248.1 |
| 2003/0232138 A1 * | 12/2003 | Tuominen et al. | 427/248.1 |
| 2004/0083959 A1 * | 5/2004 | Carpenter et al. | 118/715 |
| 2004/0083962 A1 * | 5/2004 | Bang et al. | 118/715 |
| 2004/0089235 A1 * | 5/2004 | Yamada et al. | 118/715 |
| 2004/0163590 A1 * | 8/2004 | Tran et al. | 118/715 |
| 2004/0261706 A1 * | 12/2004 | Lindfors et al. | 118/715 |
| 2005/0072357 A1 * | 4/2005 | Shero et al. | 118/715 |
| 2005/0181129 A1 * | 8/2005 | Olander | 427/248.1 |
| 2005/0211168 A1 * | 9/2005 | Yamada et al. | 118/715 |
| 2006/0024439 A2 * | 2/2006 | Tuominen et al. | 427/248.1 |
| 2006/0127827 A1 * | 6/2006 | Yoshida et al. | 431/8 |
| 2006/0137598 A1 * | 6/2006 | Kozyuk et al. | 117/11 |
| 2009/0120364 A1 * | 5/2009 | Suarez et al. | 118/715 |

FOREIGN PATENT DOCUMENTS

| | | | |
|---|---|---|---|
| JP | 63-083272 | * | 4/1988 |
| JP | 07-310185 | * | 7/1995 |
| JP | 08-97195 | * | 4/1996 |
| JP | 10-195658 | * | 7/1998 |
| JP | 11-131238 | * | 5/1999 |
| JP | 2000-150497 | * | 5/2000 |

* cited by examiner

To Reaction Chamber

→ ⟶ } Reactive Gas
◁— ⟵ } Raw Gas

● Region having a Relatively High Concentration of Reactive Gas
◌ Region having a Relatively High Concentration of Raw Gas → ⟶ } Reactive Gas
◁— ⟵ } Raw Gas ● Region having a Relatively High Concentration of Reactive Gas
◌ Region having a Relatively High Concentration of Raw Gas

FILM-FORMING APPARATUS AND FILM-FORMING METHOD

CROSS-REFERENCE TO RELATED APPLICATION

This application claims the priority of Japanese Application Nos. 117123/2002, filed Apr. 19, 2002 and Japanese Application No. 243507/2002 filed Aug. 23, 2002.

BACKGROUND OF THE INVENTION

The present invention relates to a film-forming apparatus and a method for forming a film and more particularly to a film-forming apparatus suitable for carrying out the CVD technique such as the metal organic chemical vapor deposition (MOCVD) technique as well as a method for forming a metal oxide film using the foregoing apparatus.

When forming a thin film according to the CVD technique such as the MOCVD technique, it is in general necessary to remove, from raw gases (material gases), fine particles including, for instance, foreign fine particulate substances and water to an amount as low as possible in order to satisfy such recent requirements that the semiconductor element should have a high degree of integration. Up to this time, it has, for instance, been proposed to introduce raw gases into a film-forming chamber (a reaction chamber) as a vacuum chamber after passing them through a filter member having high filtering characteristics for the purpose of the removal of these particles to a ppt level.

In general, when forming a thin film in accordance with the MOCVD technique, a mixed gas (hereunder also referred to as ▯film-forming gas▯) consisting of vaporized raw gas and a reactive gas is introduced into a film-forming chamber as a vacuum chamber and a thin film is formed on the surface of a substrate placed on a stage disposed within the vacuum chamber through a vapor phase chemical reaction. On the top face of the film-forming chamber, a gas head such as a shower plate is set up in such a manner that it is opposed to the stage and a gas-mixing chamber is fitted to this gas head. The raw gas and reactive gas fed to the mixing chamber when forming a film are introduced into the film-forming chamber, which has been evacuated to a predetermined degree of vacuum, through the gas head and then a thin film is formed on the substrate surface through a chemical reaction.

In this case, it is necessary to establish the uniform distribution of the flow rate and the concentration of the film-forming gas as well as the uniform temperature distribution in the film-forming chamber and the region just above a substrate and the amount of fine particles present in the film-forming gas, in particular, the raw gas should be reduced to a level as low as possible in order to form a thin film having uniform film quality and uniform film thickness distribution on the substrate surface.

Even if the raw gas is introduced into the reaction chamber after passing it through a filter member upon the formation of a thin film according to the MOCVD technique as has been discussed above, however, problems arise. For instance, such particles are not completely removed by simply passing the raw gas through a filter member and the service life of the filter member used in the foregoing treatment is quite short.

SUMMARY OF THE INVENTION

Accordingly, it is an object of the present invention to solve the foregoing problems associated with the conventional techniques and more specifically to provide a film-forming apparatus, which permits the effective implementation of the CVD technique such as the MOCVD technique without being accompanied by the formation of such particles and to provide a method for forming a film using the foregoing apparatus.

According to an aspect of the present invention, there is provided a film-forming apparatus, which comprises a film-forming chamber as a vacuum chamber equipped with a stage for placing and supporting a substrate in the interior thereof, a mixing chamber for forming a mixed gas comprising a raw gas and a reactive gas and connected to the film-forming chamber, a vaporization chamber for vaporizing the raw material and a gas head for introducing the mixed gas into the film-forming chamber, which is disposed on the upper face of the film-forming chamber and opposed to the stage, wherein particle traps whose temperature can be controlled (temperature controllable particle traps) are disposed and positioned between the vaporization chamber and the mixing chamber and on the downstream side of the mixing chamber, respectively. Thus, the apparatus having such a structure would permit the substantial elimination of particles from the raw gas to be introduced into the film-forming chamber and the formation of a thin film having good quality.

In the foregoing film-forming apparatus of the present invention, the particle trap disposed between the foregoing vaporization and mixing chambers (boxes) consists of an inertial dust collector type screen and the particle trap disposed on the downstream side of the mixing chamber consists of a porous filter.

In this respect, the foregoing inertial dust collector type screen comprises a mesh-like dust collecting screen plate having a plurality of through holes arranged in the same direction for introducing a gas into the mixing chamber at an angle of inclination of about 45 degrees and if this inertial dust collector type screen comprises a plurality of mesh-like dust collecting screen plates put in layers, these screen plates are arranged in such a manner that the angles of inclination of the through holes of neighboring two screen plates make an angle of 90 degrees.

The mesh-like dust collecting screen plate constituting the inertial dust collector type screen is one whose space is charged with a filler selected from the group consisting of a metal, a ceramic material and quartz.

The foregoing porous filter is preferably a sintered metal filter.

A large quantity of dry/wet particles can be collected or trapped while maintaining a low pressure loss and without causing any clogging by adopting the foregoing inertial dust collector type screen and porous filter as the particle traps and therefore, the raw gas introduced into the mixing chamber and in its turn, the mixed gas introduced into the film-forming chamber are substantially free of such particles. In addition, the service life of the porous filter such as a sintered metal filter would be elongated.

According to another embodiment of the foregoing film-forming apparatus of the present invention, the apparatus is characterized in that the mixing chamber comprises a stirring compartment equipped with a pipe for introducing a raw gas and a pipe for introducing a reactive gas into the mixing chamber and a diffusion compartment for diffusing a mixed gas obtained by stirring and admixing the raw gas and the reactive gas, that the pipes for introducing the raw gas and the reactive gas respectively are arranged in such a manner that the gas introduction ports of these pipes are opposed to one another, that a partition plate is disposed between the stirring compartment and the diffusion compartment such that the volume of the latter is larger than that of the former, that the partition plate is provided with a gas blow-off port at a desired position below the straight line connecting the foregoing gas introduction ports and that the mixed gas undergoes diffusion from the stirring compartment to the diffusion compartment through the gas blow-off port.

When using the foregoing mixing chamber, the apparatus is so designed that the mixed gas obtained by the stirring and admixing step in the stirring compartment undergoes diffusion from the stirring compartment to the diffusion compartment through the gas blow-off port formed at the desired position on the partition plate and therefore, a plurality of gases can uniformly be admixed without using a mixing chamber having a large volume even when the molecular weights of gases introduced into the mixing chamber are substantially different from one another. Therefore, it is not necessary to change the volume of the mixing chamber depending on the flow rates and kinds of a plurality of gases when admixing the plurality of gases whose molecular weights greatly differ from one another. For this reason, the mixing chamber (box) can directly and efficiently be connected to the film-forming chamber in which the step subsequent to the mixing step is carried out and accordingly, when using the resulting mixed gas in the subsequent step, the uniformly admixed gas is never returned to a turbulent flow over again. Each gas introduced into the stirring compartment of the mixing chamber moves along, for instance, the surface of the partition plate having a shape as will be detailed later to thus generate a convection current and as a result, the gases introduced into the stirring compartment can certainly and uniformly be stirred and admixed together in the stirring compartment in high efficiency. Moreover, the gases introduced can be stirred and admixed in their optimum states by appropriately adjusting the position and size of the gas blow-off port and as a result, the gases can be introduced into the diffusion compartment as a uniform mixed gas.

When introducing the mixed gas obtained by the stirring and admixing operations in the stirring compartment of the mixing chamber into the diffusion compartment, the mixed gas spontaneously diffuses according to the diffusion phenomenon due to the difference in volume between the stirring and diffusion compartments and thereafter, the uniform gas mixture can efficiently be introduced into the film-forming chamber. Thus, the mixed gas is never converted into a turbulent flow. For this reason, these gases can uniformly be admixed in the mixing chamber whose volume must not be changed depending on the flow rates and kinds of raw gases and reactive gases at a low pressure and the uniform mixed gas can be introduced into the film-forming chamber directly connected to the mixing chamber through the gas head. Thus, the apparatus permits the prevention of the occurrence of any turbulent flow of the mixed gas and the improvement and stabilization of the quality and the film thickness distribution of the thin film formed on a substrate.

According to a preferred embodiment, the partition plate is one having a convex quadratic curved shape with respect to the bottom of the mixing chamber. This would permit the obtention of a desired mixing chamber having a quite simple structure simply by positioning a partition plate having a desired curved shape.

The foregoing gas blow-off port is so designed that a pressure difference is established between the stirring compartment and the diffusion compartment by appropriately selecting the position and size of the port, whereby a strong convection current is generated in the stirring compartment to uniformly admix gases whose molecular weights are different from one another and to thus diffuse the mixed gas from the stirring compartment to the diffusion compartment having a wide space.

According to an another preferred embodiment of the present invention, the foregoing gas blow-off port is preferably disposed at a position corresponding to a half of the vertical distance between the periphery and the bottom of the partition plate. This in turn leads to the efficient diffusion of the uniform mixed gas thus obtained from the stirring compartment to the diffusion compartment.

According to a further embodiment, the film-forming apparatus is characterized in that the stage is enclosed with a cylinder-shaped sleeve member having a desired length such that the exhaust gas is discharged from a first space defined by the gas head and the stage to a second space behind the stage through the gap between the sleeve member and the inner wall of the film-forming chamber without forming any convection current and that the height of the stage is set at such a level that the volume of the second space connected to a vacuum exhaust means is larger than that of the first space.

In the latest embodiment, the film-forming apparatus is characterized in that it further comprises a gas ring, which permits the uniform introduction of an inert gas into the film-forming chamber along the inner wall of the chamber and which is disposed on the top face of the film-forming chamber.

According to an embodiment of the present invention, it is preferred that the gap between the sleeve member and the inner wall of the film-forming chamber is set at a level of not less than 10 mm (preferably 10 to 17 mm) and that the height or position at which the sleeve member is disposed is set at a level of not less than 70 mm. The film thickness distribution may fall within a desired range.

As has been described above, the raw gases introduced into the mixing chamber and in its turn, the mixed gas introduced into the film-forming chamber are almost free of the foregoing particles and it also becomes possible to establish a uniform flow rate, uniform concentration distribution and temperature distribution of the mixed gas just above the substrate by the disposition of a sleeve member having a desired size at a predetermined position, by establishing the position or height of the stage at a predetermined level and by the disposition of a gas ring for the introduction of an inert gas into the film-forming chamber and as a result, the film-forming apparatus would permit the formation of a thin film having uniform quality and thickness distribution on the substrate.

According to a still another embodiment of the foregoing film-forming apparatus, it further comprises a by-pass line equipped with a valve, which connects the primary side to the secondary side of the particle trap disposed on the downstream side of the mixing chamber.

According to a preferred embodiment of the foregoing film-forming apparatus, the apparatus comprises a plurality of particle traps disposed on the downstream side of the mixing chamber and a by-pass line equipped with a valve, which connects the primary side to the secondary side of the particle trap nearest to the film-forming chamber or which connects the secondary side of the particle trap nearest to the film-forming chamber to the primary side of the particle trap positioned at the upstream of the former. In this case, it is not always necessary to dispose a similar by-pass line on the upstream particle traps.

As has been described above, if the film-forming apparatus comprises a particle trap and a by-pass line, the raw gas and other gases to be introduced into the film-forming chamber are substantially free of the foregoing particles and simultaneously, it is possible to prevent any catching up of such particles from the particle trap and any flowing out thereof to the downstream side, due to the pressure change observed during the operations of the apparatus. Moreover, it is also possible to simultaneously remove gases remaining in the piping for the supply of raw materials and the film-forming chamber by evacuating the apparatus while the valve in the by-pass line is in its closed state after the formation of a film. As a result, the film-forming apparatus thus realized can provide a thin film having good quality.

According to an another preferred embodiment of the foregoing film-forming apparatus of the present invention, the valve fitted to the by-pass line is a variable valve.

According to another aspect of the present invention, there is provided a method for forming a film using the foregoing film-forming apparatus. According to this film-forming method, when forming a film while passing gases such as a raw gas, a reactive gas and/or a carrier gas through the film-forming chamber, these gases are passed through the film-forming chamber while opening the valve in the by-pass line, which connects the primary side to the secondary side of the particle trap arranged at the downstream side of the mixing chamber, the valve is then closed and the film-forming operation is thus initiated.

As has been discussed above, if the valve in the by-pass line is closed after flowing the gases through the film-forming chamber under the predetermined conditions while opening the valve, the operation for forming a film can be initiated without temporarily generating any significant pressure difference between the primary and secondary sides of the particle trap. This in turn results in the prevention of any catching up of such particles from the particle trap and any flowing out thereof to the downstream side, due to the pressure change observed during the operations of the apparatus.

According to a preferred embodiment of the foregoing film-forming method, the valve is a variable valve, the gases are passed through the film-forming chamber while the variable valve is in its open state and then the film-forming operation is initiated while gradually closing the valve.

Thus, the film-forming operation can be initiated without temporarily generating any significant pressure difference between the primary and secondary sides of the particle trap if using a variable valve as the valve means for the by-pass line and passing gases through the line while adjusting the variable valve. As a result, the apparatus can further reduce the generation of particles.

According to a further embodiment of the film-forming method, when interrupting the film-forming step, the gases other than the raw gas are passed through the apparatus while opening the valve in the by-pass line, which connects the primary side to the secondary side of the particle trap arranged at the downstream side of the mixing chamber and then the raw gas is run through the apparatus before again initiating the film-forming operation.

This method thus permits the initiation of the film formation without temporarily generating any significant pressure difference between the primary and secondary sides of the particle trap and as a result, the apparatus can further reduce the generation of particles.

The film-forming method according to the present invention is quite effective when achieving, for instance, the requirements for increasing the degree of integration of a semiconductor device such as the smoothening of the surface morphology of a metal oxide thin film, the improvement of the crystallizability of the film, the reduction of the film thickness, the improvement of the throwing power (step coverage) with respect to fine three-dimensional structures (or the ability of passing around behind the structures), the increase in the surface area of a substrate and the reduction of the film-forming temperature.

BRIEF DESCRIPTION OF THE DRAWINGS

FIG. 2 is a diagram schematically showing an example of the structure and arrangement of a dust collector type screen used in the present invention, in which

FIG. 3 is a diagram schematically showing an example of the structure and arrangement of a plate-like sintered metal filter, in which

FIG. 6 is a diagram schematically showing the internal structure of a stirring compartment constituting the mixing chamber as shown in FIG. 5, in which

FIG. 8 is a diagram for illustrating the gas flow behavior observed for a mixed gas within the film-forming chamber of the apparatus as shown in FIG. 7, in which

FIG. 12 is a diagram for explaining the outline of the thickness distribution observed for the thin films formed using film-forming apparatuses of the present invention and a conventional technique, wherein

DESCRIPTION OF THE PREFERRED EMBODIMENTS

Embodiments of the film-forming apparatus according to the present invention will hereunder be described in more detail with reference to the accompanying drawings.

Figure 1:
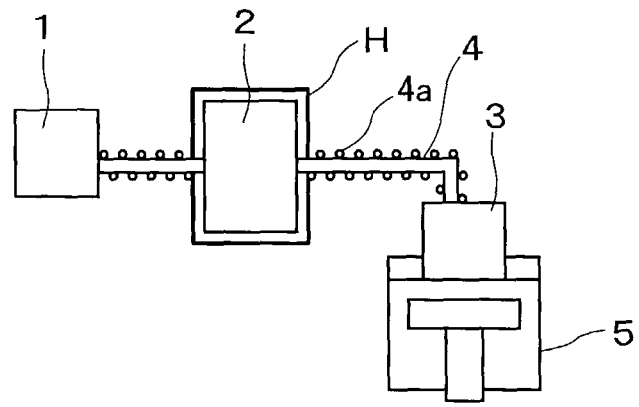
FIG. 1 is a block diagram schematically showing the outline of an embodiment of the film-forming apparatus according to the present invention.

According to an embodiment of the film-forming apparatus of the present invention, the apparatus comprises, as shown in, for instance, FIG. 1, a vaporization chamber 1, a mesh-like dust collecting screen 2 and a mixing chamber, which are connected by piping maintained at, for instance, a temperature ranging from 180 to 260° C. and the mixing chamber 3 is connected to one end of a raw gas-supply pipe 4 and one end of a reactive gas-supply pipe (not shown). The other end of the raw gas-supply pipe 4 is connected to the vaporization chamber 1 so that the raw gas obtained by vaporization of an organometal diluted with an organic solvent can be introduced into the mixing chamber through the dust collector type screen 2. The mixed gas from the mixing chamber 3 is introduced into a film-forming chamber 5 through a gas head fitted to the film-forming chamber 5. A porous filter (not shown) (this will hereunder be described while taking a sintered metal filter by way of example) is disposed on the downstream side of the mixing chamber 3 and in the proximity to the gas head so that the mixed gas can further be filtered. Alternatively, this sintered metal filter used may comprise a plurality of filters having different mesh sizes put on top of each other directly or through spacers.

The mesh-like dust collector type screen 2 is disposed between the vaporization chamber 1 and the mixing chamber 3 and may be any one inasmuch as it has a structure, which may serve as a temperature controllable particle trap for the removal of unnecessary particles present in the raw gas. For instance, the dust collector type screen 2 comprises a mesh-like dust collecting screen plate having a plurality of through holes, arranged in the same direction, for introducing a gas into the mixing chamber at an angle of inclination of about 45 degrees and in the case where this inertial dust collector type screen comprises a plurality of mesh-like dust collecting screen plates put in layers, these screen plates are preferably arranged in such a manner that the angles of inclination of the through holes of neighboring two screen plates make an angle of 90 degrees. An example of such a dust collector type screen plate usable herein may be PYRO-SCREEN (registered trade mark) available from NUNOBIKI Seisakusho K.K.

Moreover, the raw gas-supply pipe 4 is preferably provided with a heating means 4a such as a heater.

Figure 2A:
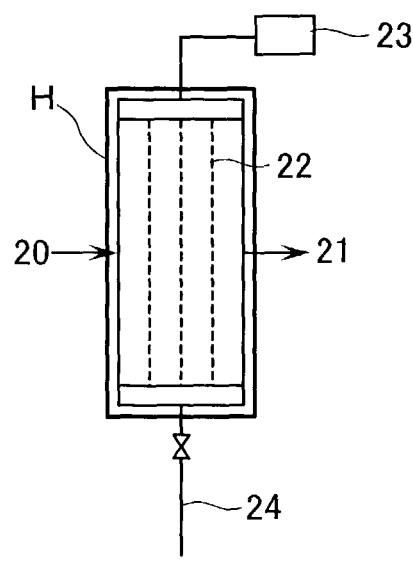
FIG. 2(a) is a cross sectional view schematically showing an example of the structure and arrangement thereof and FIG. 2(b) is a cross sectional view schematically showing another example of the structure and arrangement thereof.

The dust collector type screen 2 shown in FIG. 1 may be, for instance, a particle trap having a structure and arranged as shown in FIGS. 2(a) and (b) and it is designed in such a manner that the temperature thereof can be controlled by the heating means H such as a heater independent of the piping.

The arrangement and structure of this particle trap are not to specific ones inasmuch as they would permit the collection of unnecessary particles. For instance, a plurality of screen plates 22 are horizontally put in layers along the direction perpendicular to the flow direction of the raw gas (or perpendicular to the direction from the inlet 20 for the introduction of the raw gas from the vaporization chamber towards the outlet port 21 for discharge), as shown in FIG. 2(a). The trap is preferably designed in such a manner that when the screen plates 22 are covered with such particles, a solvent 23 is passed therethrough from the top and discharged from the bottom (through a drain 24) to thus make the screen plates clean.

Figure 2B:
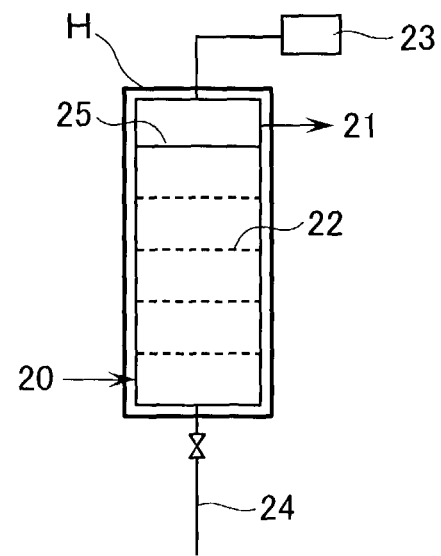

Moreover, as shown in FIG. 2(b), the particle trap may likewise be designed in such a manner that the raw gas from the vaporization chamber is introduced into the same through the lower inlet 20 and discharged from the upper outlet 21. In this case, a plurality of screen plates 22 are horizontally put in layers in the direction perpendicular to the flow direction of the raw gas stream. The trap is likewise preferably designed in such a manner that when the screen plates 22 are covered with such particles, a solvent 23 is passed therethrough from the top and discharged from the bottom (through a drain 24) to thus make the screen plates clean. In this respect, a filter 25 may be disposed above the uppermost layer of the screen plates put in layers and in front of the output 21.

Materials for the foregoing dust collector type screen may be determined or selected while taking into consideration a variety of factors such as the resistance to corrosion by the raw gas, mechanical characteristic properties and resistance to temperatures (up to about 300° C.). For instance, such a material may be selected from the group consisting of nickel and alloys thereof (such as Hastelloy (registered trademark) and Inconel (registered trademark)), stainless steel (such as 316 and 316L), aluminum, titanium and ceramics.

Figure 3A:
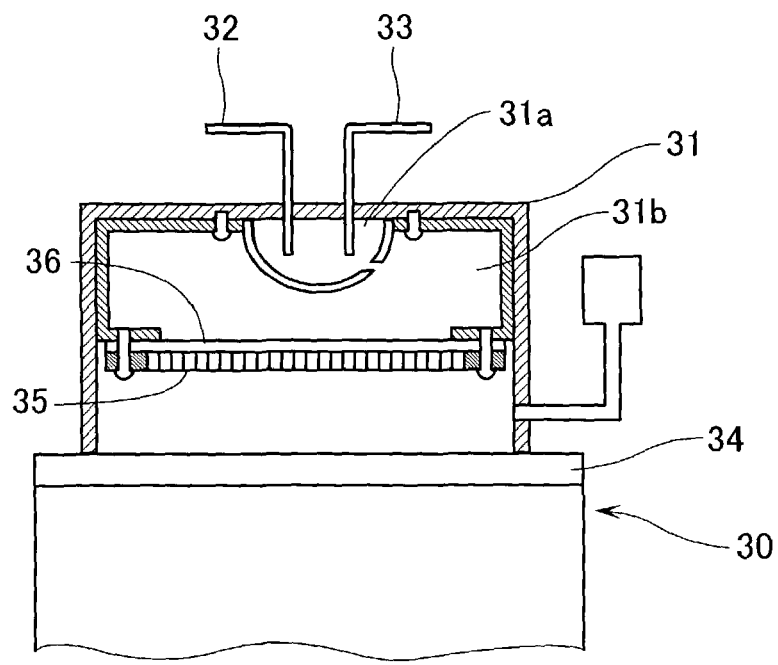
FIG. 3(a) is a cross sectional view schematically showing an example of the structure and arrangement of such a sintered metal filter and FIG. 3(b) is a cross sectional view schematically showing an example of the structure and arrangement of a pleat-like sintered metal filter.
Figure 3B:
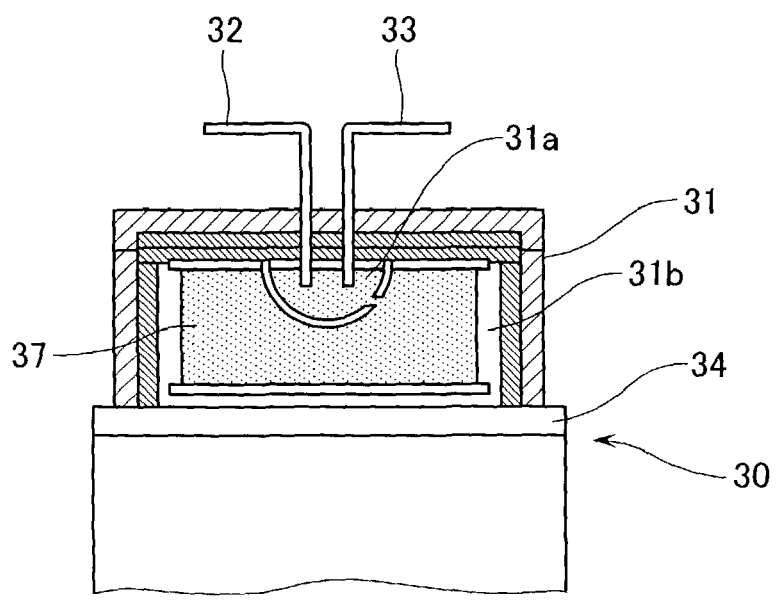

In the film-forming apparatus of the present invention, as shown in FIG. 3, a gas head such as a shower plate for the introduction of the mixed gas towards the surface of a substrate positioned within the film-forming chamber is arranged at the position behind the mixing chamber for admixing the raw gas obtained by vaporization of an organometal diluted with an organic solvent with a reactive gas such as oxygen gas. At least one sintered metal filter is arranged on the downstream side of the mixing chamber and in the proximity to the gas head as a particle trap and the filter may be temperature controllable one. The sintered metal filter permits the removal of particles present in the raw gas and the simultaneous removal of particles present in the mixed gas introduced into the film-forming chamber and towards the substrate by the action of the foregoing dust collector type screen to thus allow the formation of a thin film having good quality. The sintered metal filter is a so-called porous filter, but the filter may likewise be one produced from a porous material such as a ceramic material, quartz or fluorocarbon (resin) depending on the temperature region used and the kinds of gases used, in addition to the foregoing sintered metal filters.

Incidentally, the temperature of the foregoing sintered metal filter is controlled by external heating of the same or by heating a filter support and it may be set at a level higher than that of the piping.

For instance, the film-forming apparatus as shown in FIG. 3(a) is designed in such a manner that a pipe 32 for guiding a raw gas from a vaporization chamber (not shown) and a pipe 33 for guiding a reactive gas from a reactive gas source are disposed above a stirring compartment 31a of a mixing chamber 31 connected to the film-forming chamber 30, that the mixed gas obtained in the stirring compartment is diffused into a diffusion compartment 31b and that the mixed gas from the diffusion compartment 31b is introduced into the film-forming chamber through a plate-like sintered metal filter 36 and a gas head 34. The sintered metal filter 36 is fitted to a support member 35 attached to the mixing chamber by fixing tools on the downstream side of the mixing chamber 31. The filter 36 may be heated by a heating means such as a heater (not shown). Moreover, the shape of the sintered metal filter may be a cylindrical one in addition to the plate-like one shown in the attached figures or may be one processed into a pleat-like shape (waved shape) for increasing the effective area of the filter. Alternatively, it may likewise be a combination of a plurality of filters having different mesh sizes.

In addition, the film-forming apparatus as shown in FIG. 3(*b*) is so designed that a pipe 32 for guiding a raw gas from a vaporization chamber (not shown) and a pipe 33 for guiding a reactive gas from a reactive gas source are disposed above a stirring compartment 31*a* of a mixing chamber 31 connected to the film-forming chamber 30, that the mixed gas obtained in the stirring compartment is diffused into a diffusion compartment 31*b* and that the mixed gas from the diffusion compartment 31*b* is introduced into the film-forming chamber through a gas head 34. Within the mixing chamber 31, a cylindrical pleat-like sintered metal filter 37 is fitted to the chamber. The filter 37 may be heated by a heating means such as a heater (not shown).

Materials for the foregoing sintered metal filter may be determined or selected while taking into consideration a variety of factors such as the resistance to corrosion by the raw gas and the reactive gas, mechanical characteristic properties and resistance to temperatures. For instance, such a material may be selected from the group consisting of sintered bodies of metallic fine wires of nickel and alloys thereof (such as Hastelloy (registered trademark) and Inconel (registered trademark)) and stainless steel (such as 316 and 316L). An example of such a filter usable herein may be one made from stainless steal fibers available from Nippon Seisen K.K.

The particle trap consisting of a dust collector type screen and a sintered metal filter, which is arranged as has been described above, permits effective collection of dry/wet particles in a high collection efficiency without causing any significant pressure loss and any clogging and accordingly, the mixed gas introduced into the film-forming chamber is substantially free of such undesirable particles. Moreover, the service life of the sintered metal filter can be elongated or extended as compared with that observed when only a filter is disposed.

In the film-forming apparatus equipped with a particle trap in order to prevent any particle from flowing in the film-forming chamber as shown in FIGS. 1 to 3, a large pressure difference is sometimes temporarily generated between the primary and secondary sides of the particle trap disposed in the mixing chamber when initiating the introduction of gases such as a raw gas, a reactive gas and a carrier gas into the film-forming chamber through the gas head. This pressure difference causes catching up of particles from the particle trap in the mixing chamber and flowing out thereof to the downstream side and as a result, there has often been observed an increase in the number of particles on the wafers in the earlier production lot.

Moreover, in the film-forming apparatus, the valve is opened and closed to switch the supply of the raw gas from the vent line to the film-forming chamber upon initiating the formation of films on wafers of each production lot and particles are sometimes generated at this stage. It is recognized that this would be caused due to a temporary pressure change observed between the primary and secondary sides of the particle trap.

Under such circumstances, the film-forming apparatus is desirably designed in such a manner that it has a structure as will be detailed below in order to further reduce the total number of particles having a size of not less than 0.2 μm.

Figure 4:
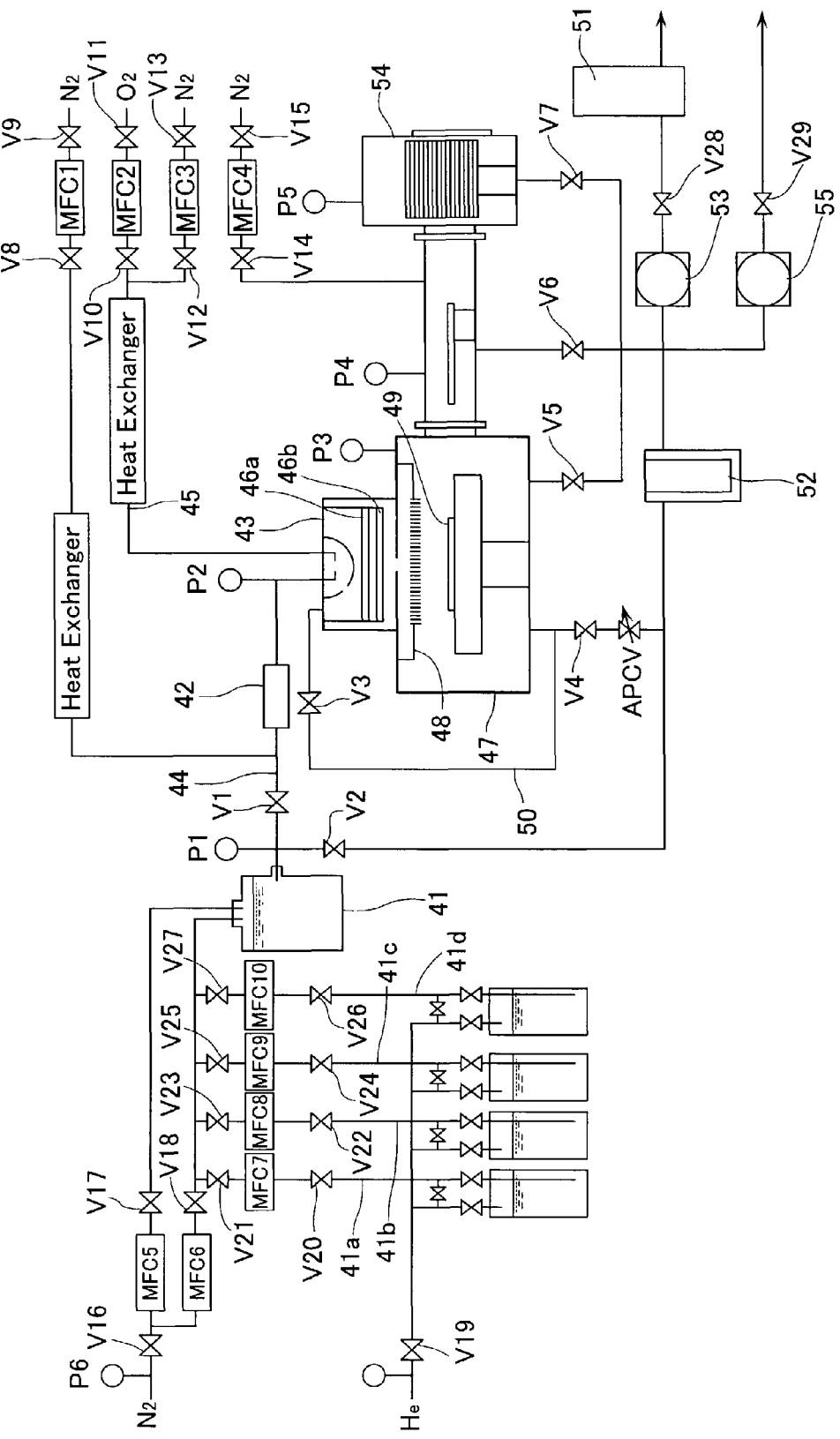
FIG. 4 is a block diagram schematically showing the outline of another embodiment of the film-forming apparatus according to the present invention.

According to a further embodiment of the film-forming apparatus of the present invention, the apparatus comprises, for instance, a vaporization chamber, a mesh-like dust collector type screen 42 and a mixing chamber, which are connected by piping maintained at a temperature ranging from 180 to 260° C. as shown in FIG. 4, wherein the mixing chamber is connected to one end of a raw gas supply pipe 44 and one end of a pipe 45 for supplying a reactive gas such as oxygen gas. The other end of the raw gas supply pipe 44 is connected to the vaporization chamber 41 so that the raw gas obtained by vaporizing an organometal diluted with an organic solvent can be introduced into the mixing chamber 43 through the dust collector type screen 42 as a particle trap. On the other hand, the other end of the reactive gas supply pipe 45 is connected to a reactive gas bomb and a carrier gas bomb so that these gases can be introduced into the mixing chamber 43. The raw gas supply pipe 44 and the reactive gas supply pipe 45 are preferably equipped with a heating means such as a heater and a heat exchanger.

The dust collector type screen 42 is positioned between the vaporization chamber 41 and the mixing chamber 43 and may be any one inasmuch as it has a structure capable of serving as a temperature controllable particle trap for the removal of particles present in the raw gas. Dust collector type screens usable herein may be those described above.

The position and structure of the dust collector type screen 42 are not particularly restricted inasmuch as they may allow the collection of particles. For instance, the dust collector type screen may be a particle trap having a structure and arranged as shown in FIGS. 2(*a*) and (*b*). The materials for the dust collector type screen have likewise been described above.

Particle traps or temperature controllable porous filters 46*a* and 46*b* (such a filter will hereunder be described while taking a sintered metal filter by way of example) are disposed on the downstream side within the mixing chamber 43 for admixing gases such as a raw gas and a reactive gas introduced into the chamber in the manner as has been described above so that the mixed gas can further be filtered and introduced into the film-forming chamber 47. The mixed gas is introduced into the film-forming chamber 47 through a gas head 48 such as a shower plate disposed on the top face of the film-forming chamber, which is in turn directly connected to the mixing chamber 43.

These sintered metal filters 46*a* and 46*b* are used in this apparatus for the purpose of further removal of particles present in the mixed gas from which particles have been removed in the dust collector type screen and which is introduced into the film-forming chamber 47 and guided to the surface of a substrate 49 positioned therein to thus give a thin film having good quality. The sintered metal filters usable herein may be those listed above and they may be temperature controllable ones as has been described above and the temperature thereof can thus be set at a level higher than that of the piping.

Moreover, the sintered metal filter may comprise a single filter or a combination of at least two filters as shown in FIG. 4. When using a plurality of such filters, filters having different mesh sizes may be put in layers directly or through spacers.

This sintered metal filter is the same as that explained above in connection with the film-forming chamber shown in FIGS. 3(*a*) and (*b*).

In addition, the foregoing film-forming apparatus is provided with a by-pass line 50 equipped with a valve (V3) and connecting the primary and secondary sides of the sintered metal filters 46*a*, 46*b* arranged on the downstream side within the mixing chamber 43, as shown in FIG. 4. When using a plurality of sintered metal filters, it is sufficient to dispose a by-pass line equipped with a valve and connecting the primary and secondary sides of the filter nearest to the film-forming chamber 47.

As shown in FIG. 4, to the vaporization chamber 41, there are connected 4 kinds of raw material supply systems 41*a*, 41*b*, 41*c* and 41*d* and each supply system is so designed that each raw material included in a container is entrained by, for instance, He gas while adjusting a valve element (V20 to V27) and fed to each corresponding supply system and further entrained by, for instance, $N_2$ gas through a flow rate controller (MFC7 to 10) and guided to the vaporization chamber 41. The raw gas produced in the vaporization chamber 41 is transported to the mixing chamber 43 through the piping 44 and the dust collector type screen 42. Supply systems for a reactive gas ($O_2$) and an inert gas ($N_2$) such as a carrier gas are connected to the mixing chamber 43 and each supply system is so designed that the reactive gas and carrier gas included in gas bombs are transported to the mixing chamber 43 through flow rate controllers (MFC1 to 4), heat exchangers and piping 45, by appropriately adjusting a valve element (V10 to V13). An exhaust gas processing system 51 is connected to the line, which communicates the vaporization chamber 41 with the dust collector type screen 42, the film-forming chamber 47 and the by-pass line 50, through a cold trap 52 and a vacuum pump 53 such as a dry pump. The film-forming chamber 47 is also connected to an exhaust system 54 for allowing the control of the degree of vacuum in the chamber and the exhaust system may likewise be connected to a vacuum pump 55 such as a dry pump. In FIG. 4, P1 to P6 each represents a pressure gauge, V1 to V29 each represents a valve element and MFC1 to MFC10 each represents a flow rate controller.

Figure 5:
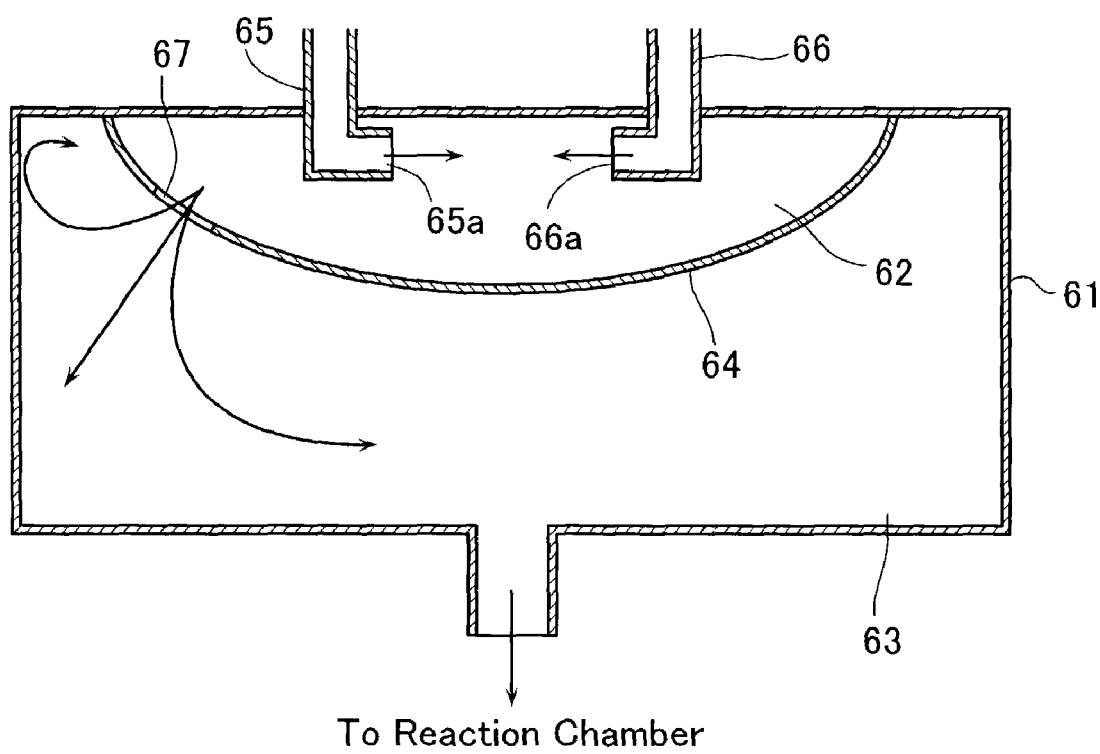
FIG. 5 is a cross sectional view schematically showing an embodiment of a mixing chamber used in the film-forming apparatus according to the present invention.

Next, embodiments of the mixing chamber used in the foregoing film-forming apparatus according to the present invention will be described below in detail with reference to the accompanying drawings (FIGS. 5 and 6).

FIG. 5 is a cross sectional view schematically showing the internal structure of the mixing chamber; FIG. 6(*a*) is a cross sectional view schematically showing the internal structure of the stirring compartment in the mixing chamber shown in FIG. 5; and FIG. 6(*b*) is a schematic top plan view of the internal structure shown in FIG. 5. In FIGS. 5 and 6, the same constituent elements are indicated by the same reference numerals. Incidentally, in FIGS. 6(*a*) and (*b*), arrows indicated by solid and dotted lines and alternate long and short dash lines and two-dot chain lines show tendencies of the results obtained in the fluid analysis according to the computer simulation of the reactive gas stream and the raw gas stream in relation to respective gas streams and gas distribution patterns.

As has been shown in FIG. 5, the mixing chamber 61 has a hollow cylindrical shape of a desired size, comprises a stirring compartment 62, a diffusion compartment 63 and a partition plate 64 for separating the stirring compartment from the diffusion compartment and is directly connected to a film-forming chamber (a reaction chamber) for carrying out the subsequent processing using the resulting film-forming gas. A gas-introduction pipe 65 for the introduction of at least one raw gas and a reaction gas-introduction pipe 66 are fitted to the upper portion of the stirring compartment 62 and the gas-introduction inlets 65*a* and 66*a* thereof are arranged such that they are opposed to one another. The partition plate 64 is provided with a gas-supply opening 67 having a desired size and arranged at a desired position, which is on the lower side of the direction perpendicular to the straight line connecting the gas-introduction inlets 65*a* and 66*a* and which corresponds to about □ time the vertical distance from the periphery of the foregoing partition plate 64 to the bottom thereof, in order to efficiently guiding the film-forming gas comprising the mixed raw gas and reactive gas from the stirring compartment 62 to the diffusion compartment 63.

These raw gas-introduction pipe 65 and reactive gas-introduction pipe 66 are fitted to the upper wall surface of the mixing chamber 61 and at positions corresponding to the central portion (near the inflection point) of the partition plate 64, which are in a point symmetrical relation with respect to the central point of the partition plate 64, as will be seen from FIG. 5 and FIGS. 6(*a*) and 6 (*b*) and the gas-introduction inlets 65*a* and 66*a* are arranged in such a manner that the gas-introduction directions thereof are opposed to one another.

In the foregoing mixing chamber 61, the partition plate 64 is formed into a semi-spherical shape having a convex partition plane like a quadratic curve and are fitted, without forming any gap, on the side of the upper wall surface of the mixing chamber to which the raw gas-introduction pipe 65 and the reactive gas-introduction pipe 66 are fitted.

The interior of the mixing chamber 61 is divided into the stirring compartment 62 and the diffusion compartment 63 by the partition plate 64 and these compartments are designed in such a manner that the volume of the diffusion compartment 63 is larger than that of the stirring compartment 62. In the case of the foregoing mixing chamber, the ratio of the volume of the stirring compartment 62 to that of the diffusion compartment 63 is not restricted to specific one, but it is preferred that the ratio in general ranges from 1:5 to about 1:2 for the achievement of satisfactory stirring, mixing and diffusion of gases used as a film-forming gas.

In the mixing chamber having the foregoing construction, at least one raw gas and a reactive gas may be introduced into the stirring compartment 62 of the mixing chamber 61 through the respective gas-introduction inlets 65*a* and 66*a* of the raw gas-introduction pipe 65 and the reactive gas-introduction pipe 66, while the film-forming chamber directly connected to the mixing chamber is evacuated. Thus, as shown in FIGS. 6(*a*) and (*b*), the raw gas stream is separated by the reactive gas stream within the stirring compartment 62, the both gases flow along the partition plate 64 on the surface thereof and as a result, a convection flow is generated so that the raw gases and the reactive gas are stirred and mixed together. Then as has been shown in FIG. 5, the film-forming gas comprising the mixed raw gas and reactive gas is smoothly introduced into the diffusion compartment 63 through the gas-supply inlet 67 and diffuses therein. As has been described above, the volume of the diffusion compartment 63 is larger than that of the stirring compartment 62 and therefore, the film-forming gas from the stirring compartment is introduced into the diffusion compartment and is diffused therein, because of the diffusion phenomenon of the gas due to the difference in volume between these compartments when the gas is transferred from the stirring compartment to the diffusion compartment.

The film-forming apparatus equipped with the foregoing mixing chamber has a film-forming chamber connected to a vacuum evacuation system and a wafer stage for supporting a subject on which a film is to be deposited is placed and arranged within the film-forming chamber. A gas head is fitted to the film-forming chamber at the upper portion thereof and the gas head is directly connected to the mixing chamber, which is fitted to the film-forming chamber on the top thereof. In addition, this mixing chamber is connected to a raw gas-vaporization system through a dust collector type screen as a particle trap and a reactive gas source. The film-forming gas uniformly admixed according to the foregoing method is introduced into the gas head, which is arranged in the proximity to the mixing chamber and directly connected thereto in such a manner that the flow path thereof or the distance between the mixing chamber and the gas head is minimized or reduced to a level as short as possible and then fed to the surface of the subject, which is placed on the wafer stage and on which a film is formed in the film-forming chamber without forming any turbulent flow therein.

Since the foregoing mixing chamber is so designed that a raw gas and a reactive gas are stirred and mixed together in the stirring compartment 62 and then the film-forming gas thus prepared by stirring and mixing the gases is diffused in the diffusion compartment 63, the raw gas and the reactive gas can uniformly be admixed together even when these gases have molecular weights greatly different from one another. Therefore, it is not necessary to use a mixing chamber having a large volume. Accordingly, the volume of the mixing chamber is not largely influenced by the flow rate and kind of the film-forming gas and the mixing chamber can directly be connected to a film-forming chamber. For this reason, the uniformly admixed film-forming gas is never converted into a turbulent flow once more.

Figure 6A:
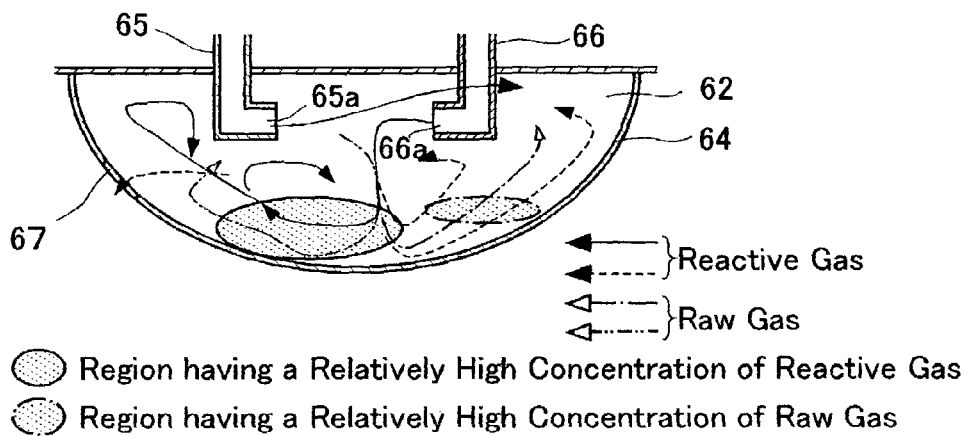
FIG. 6(a) is a cross sectional view thereof and FIG. 6(b) is a top plan view thereof.
Figure 6B:
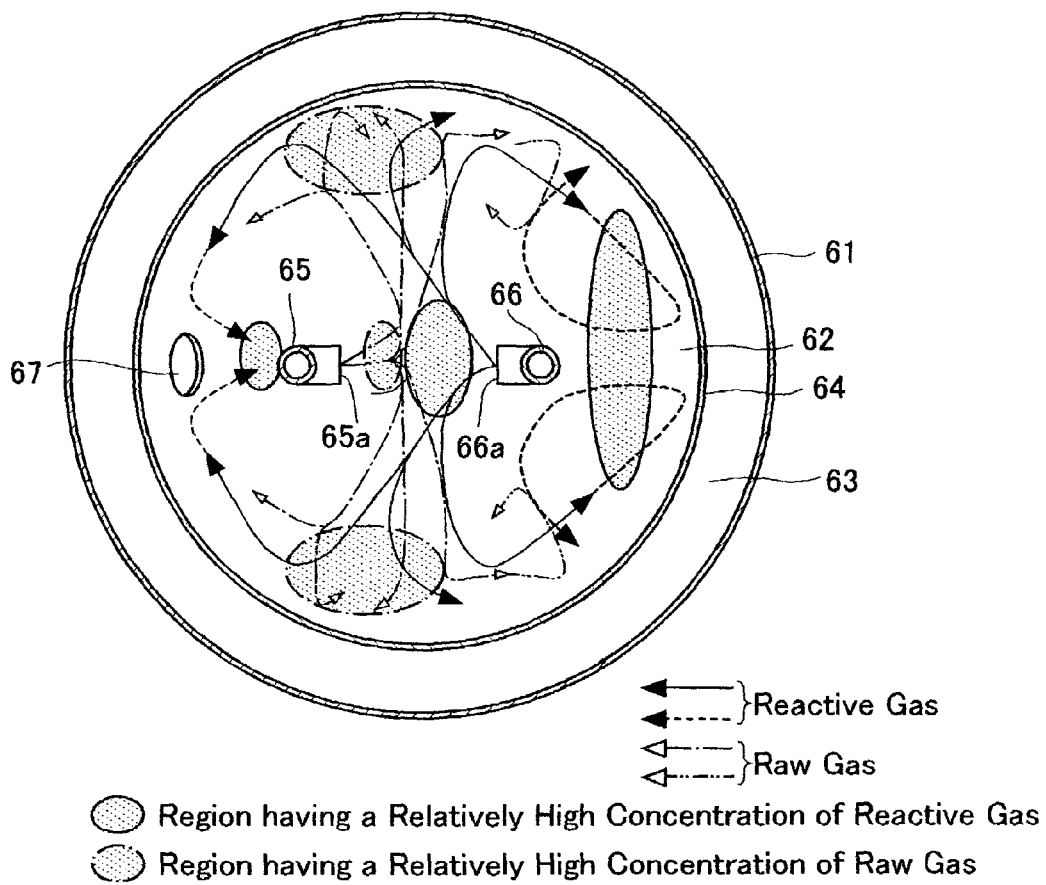

When using the foregoing mixing chamber, the gas-supply inlet 67 disposed on the partition plate 64 is positioned in the vicinity of the raw gas-introduction pipe 65, as shown in FIGS. 5, 6(a) and 6(b), the film-forming gas, which undergoes vigorous convection in this portion is smoothly introduced into the diffusion compartment 63 through the gas-supply inlet 67. In this respect, the gas-supply inlet 67 disposed on the partition plate 64 may likewise be arranged in the proximity to the reactive gas-introduction pipe 66. Moreover, since the volume of the diffusion compartment 63 is larger than that of the stirring compartment 62, the film-forming gas is uniformly admixed, because of the diffusion phenomenon of the gas due to the difference in volume between these compartments when the gas is transferred from the stirring compartment to the diffusion compartment. The film-forming gas thus uniformly admixed is introduced into the gas head, which is arranged in the proximity to the mixing chamber and directly connected thereto in such a manner that the flow path thereof between the mixing chamber and the gas head is minimized and then fed to a substrate in the film-forming chamber without being converted into turbulent flow.

According to the present invention, in the case of the foregoing mixing chamber 61, a sintered metal filter as shown in FIG. 4 is disposed on the downstream side of the mixing chamber (not shown in FIG. 5) and a by-pass line equipped with a valve, which may be a variable valve, is arranged between the primary and secondary sides of this filter.

Then, a film-forming apparatus according to another embodiment of the present invention will hereunder be described with reference to FIGS. 7, 8(a) and 8(b).

Figure 7:
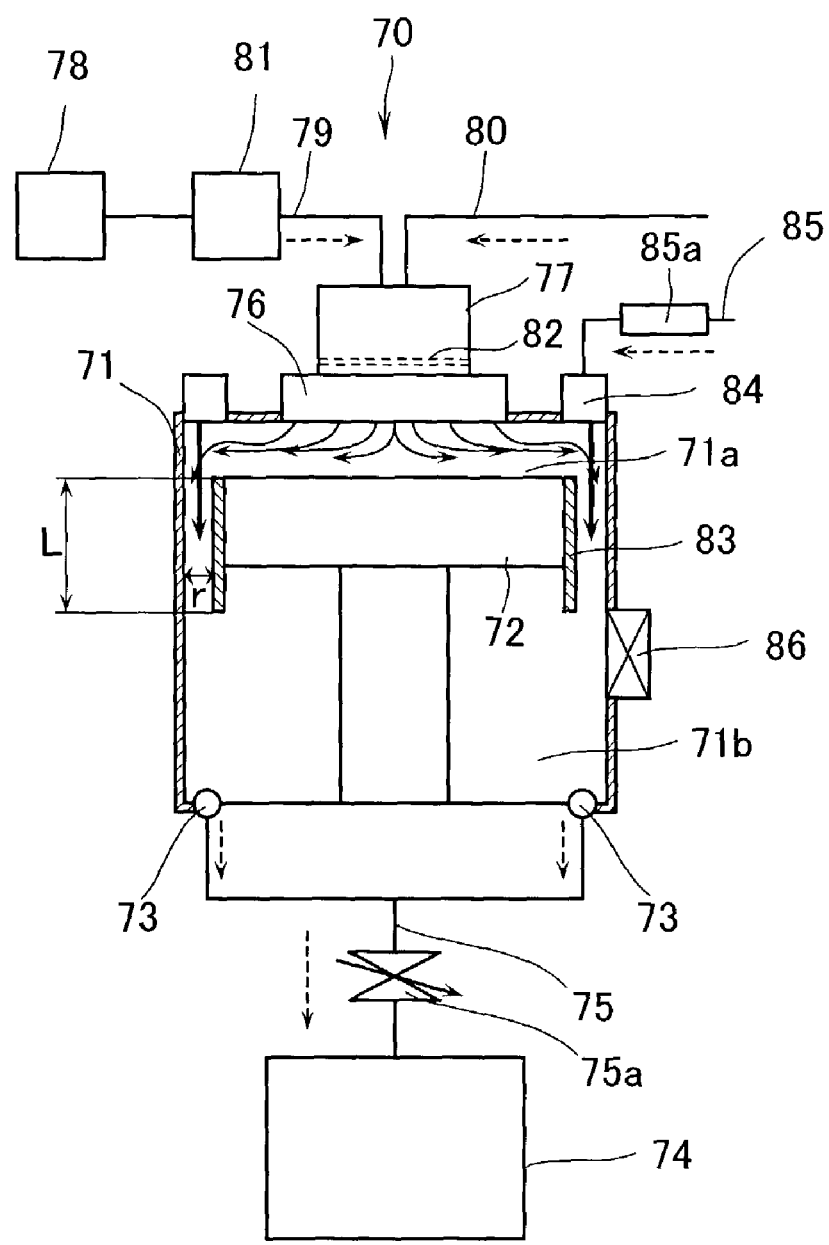
FIG. 7 is a block diagram schematically showing the outline of a still another embodiment of the film-forming apparatus according to the present invention.

In FIG. 7, the film-forming apparatus 70 comprises a film-forming chamber 71 having a cylindrical shape. A stage 72 having a cylindrical shape for placing a substrate such as a silicon wafer is disposed within the film-forming chamber. This stage 72 is provided with a heating means (not shown) such as a heater for heating the substrate. This stage is provided with a means for making the stage freely movable up and down between a level in the film-forming chamber 71 at which a film is formed and a level therein at which substrates are conveyed and which exists in the lower portion of the chamber.

Two exhaust ports 73 are formed on the lower side of the film-forming chamber 71 and a vacuum evacuation means 74 constituted by, for instance, a turbo molecular pump or a rotary pump is connected to the exhaust ports through an exhaust pipe 75. Moreover, a gas head 76 is positioned at the central portion on the upper surface of the film-forming chamber 71 such that the gas head is opposed to the stage 72.

The mixing chamber 77, which may be one as shown in FIG. 5, is disposed on the upstream side of this gas head 76 and the mixing chamber is connected to one end of a gas pipe 79 for a raw gas the other end of which is connected to a vaporization chamber 78 and one end of a gas pipe 80 for a reactive gas the other end of which is connected to gas sources. Moreover, in the film-forming apparatus shown in FIG. 7, a dust collector type screen 81 as a screen as shown in FIG. 2 is disposed between the mixing chamber 77 and the vaporization chamber 78 and a sintered metal filter 82 as a filter shown in FIG. 3 is disposed on the downstream side of the mixing chamber 77 and in the proximity to the gas head 76. Thus, if the film-forming apparatus has such a structure defined above, the raw gas and the reactive gas are fed to the mixing chamber 77 while controlling the flow rates of these gases by a mass flow controller (not shown) and the gas mixture, which is uniformly admixed at a desired mixing ratio in the mixing chamber 77 and from which particles are removed, is injected towards the central portion of the substrate through the gas head 76. In other words, the raw gas from the vaporization chamber 78 is introduced into the mixing chamber 77 through the dust collector type screen 81, while the mixed gas from the mixing chamber 77 is introduced into the film-forming chamber 71 through the sintered metal filter 82 and the gas head 76.

According to the present invention, in the case of the foregoing mixing chamber 77, a by-pass line equipped with a valve, which may be a variable valve, is arranged on the downstream side of the mixing chamber (not shown in FIG. 7) and between the primary and secondary sides of sintered metal filter 82 as shown in FIG. 4.

Incidentally, when forming a thin film on a substrate according to the MOCVD process, if the temperature of the raw gas is reduced to not more than the evaporation point thereof, the raw gas is separated out in the form of particles and this becomes a cause of the dust-formation during the film-forming step within the film-forming chamber 71. For this reason, a heat exchanger (not shown) as a temperature control means is arranged in the gas pipe 79 for raw gas. Moreover, a heating means such as a heater may be arranged on the external wall of the film-forming chamber 71 and the stage 72 in order to prevent any separation or deposition of the raw gas.

In this respect, to make, more uniform, the thickness distribution and compositional distribution of the thin film formed on a substrate according to the MOCVD process and to further improve the reproducibility of these distributions, it is quite important to isotropically evacuating the exhaust gas comprising, for instance, the mixed gas free of any contribution to the process from the circumference of the substrate and to thus make the gas flow from the gas head 76 to the vacuum exhaust means 74 uniform. To this end, it is in particular necessary to prevent the generation of any convection current, turbulent flow within a first space 71a existing below the gas head 76 and above the stage 72.

The film-forming apparatus according to the present invention is designed in such a manner that a sleeve member 83 having a desired height L surrounds the stage 72. In this case, the volume of a second space 71b formed below the stage is set at a value larger than that of the first space 71a so that the exhaust gas is isotropically discharged through a circular interstice (r) formed by the sleeve member 83 and the inner wall of the film-forming chamber 71. In addition, a pressure control valve 75a may be disposed on the exhaust pipe 75 so that the pressure conditions may be adjusted depending on the MOCVD processes.

As has been described above, if incorporating a heating means into the stage 72 for heating the substrate up to a desired temperature, heat convection may generate above the substrate. Thus, a gas ring 84 for uniformly introducing an inert gas into the film-forming chamber 71 along the inner wall of the chamber 71 is disposed at the upper portion of the chamber 71 such that the ring may surround the gas head 76. The exhaust gas discharged from the second space 71b through the interstice between the sleeve member 83 and the inner wall of the film-forming chamber 71 may more certainly be exhausted isotropically from the periphery of the sleeve member 83 due to the intentional rectification action of the inert gas injected through the gas ring 84. Thus, the apparatus can prevent the occurrence of any turbulent flow, convection flow and heat convection in the first space. In this respect, it is possible to set the volume of the first space when the stage is at the film-forming position at, for instance, 2.8 L and that of the second space at 13 L.

Figure 8A:
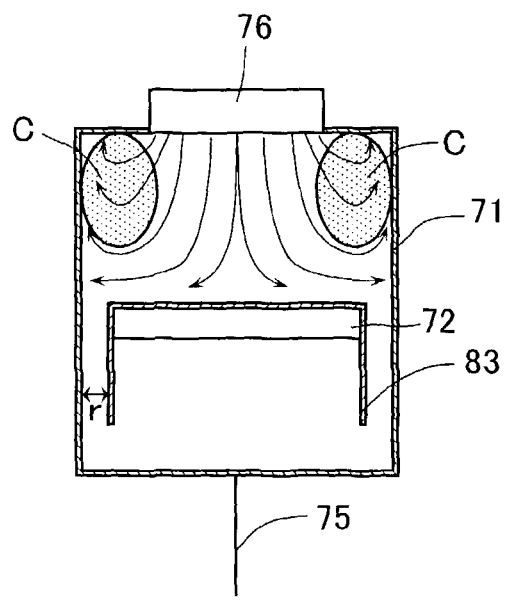
FIGS. 8(a) and 8(b) are cross sectional views of the film-forming chamber as will be encountered when the gap between the stage and the gas head is wide and narrow, respectively.
Figure 8B:
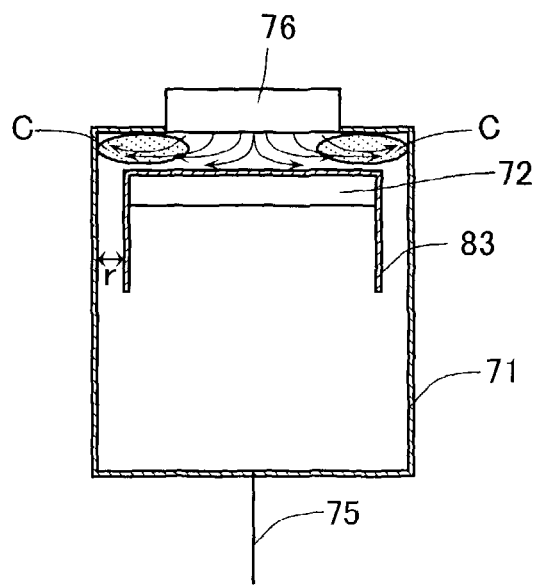

Regarding the height or position of the stage 72 in the film-forming chamber 71, if the distance between the gas head 76 and the stage 72 is too long as shown in FIG. 8(a), the exhaust gas is not completely discharged and accordingly, a convection current C may be generated at the upper corner of the film-forming chamber 71. On the other hand, if the distance between the gas head 76 and the stage 72 is too short as shown in FIG. 8(b), the mixed gas injected from the gas head 76 is reflected by the substrate and thus a convection current C may be generated at the upper corner of the film-forming chamber 71. For this reason, it is necessary to set the distance between the gas head 76 and the stage 72 during the film-forming step at such a level that any such convection current C cannot easily be generated.

Moreover, if a substrate-conveying port for transporting the substrate to the stage 72 is arranged in such a region that the port is confronted by the first space 71a, a turbulent flow is generated at the periphery of the substrate-conveying port. For this reason, it would be favorable that a means for ascending and descending the stage (not shown) is disposed on the stage 72 so that the stage 72 can freely go up and down between the film-forming position on the upper side of the film-forming chamber 71 and the substrate-transporting position on the lower side of the chamber. Then the substrate-conveying port 86 (FIG. 7) is arranged at a desired position on the side wall of the film-forming chamber 71 corresponding to the substrate-transporting position.

In the case of the film-forming apparatus shown in FIG. 7, a heat exchanger 85a as a temperature control means can be fitted to the gas pipe 85 communicated with the gas ring 84 so that the temperature of the inert gas injected from the gas ring 84 can be controlled to thus prevent any separation of the raw gas in the form of particles in the MOCVD process.

As has been described above, the film-forming apparatus of the present invention comprises a particle trap and a by-pass line and the apparatus preferably comprises a mixing chamber, provided with a partition plate of a specific shape so that when introducing, into the diffusion compartment, the film-forming gas prepared by stirring and admixing a raw gas and a reactive gas in the stirring compartment constituting the mixing chamber, the film-forming gas spontaneously undergoes diffusion due to the diffusion phenomenon induced by the difference in volume between the stirring and diffusion compartments. Accordingly, the use of these film-forming apparatuses having a quite simple structure permits the formation of a thin film having good quality. More specifically, the apparatus permits the direct introduction of the uniformly admixed film-forming gas free of any particle into the film-forming chamber, the film-forming gas is thus never converted into any turbulent flow and it is accordingly possible to improve and stabilize the quality of the thin film formed and the thickness distribution thereof.

The present invention is not restricted to the specific embodiments described above at all and the present invention thus includes a variety of variations and modifications of these specific embodiments. For instance, a partition plate having a semi-spherical shape is used in the foregoing embodiments as the partition plate, but the features of the partition plate such as the curvature, shape (such as cylindrical, cubic and cone-like shapes) and size thereof may variously be changed depending on the kinds of gases used and processes selected. Moreover, the position on which the gas-supply inlet to be disposed on the partition plate and the shape thereof can likewise be appropriately be changed depending on the processes inasmuch as the apparatus is designed in such a manner that the raw gas and the reactive gas are stirred and admixed and then uniformly introduced into the diffusion compartment. If a gas-supply inlet is positioned in the proximity to the portion at which the film-forming gas undergoes vigorous convection in the stirring compartment like the foregoing embodiment, the film-forming gas can smoothly be introduced into the diffusion compartment. For instance, if a gas-supply inlet is positioned in a region falling within the range of from +45 degrees to −45 degrees as expressed in terms of the angle between the center of the line connecting the raw gas-introduction inlet and the reactive gas-introduction inlet and the upper and lower directions of the line, it is possible to uniformly admix these gases and to smoothly introduce the uniform gas mixture into the diffusion compartment.

In the foregoing embodiment, the partition plate is fitted to the mixing chamber (box) such that any interstice is not formed between the partition plate and the wall surface on the gas-introduction side, but it is also possible to make an interstice between the periphery of the partition plate and the wall surface of the mixing chamber on the gas-introduction side so far as the film-forming gas is sufficiently stirred and admixed.

In addition, the foregoing embodiment has been described while taking a mixing chamber comprising one stirring compartment and one diffusion compartment by way of example, but it is also possible to admix the film-forming gas mixture using a mixing chamber comprising at least two stirring compartments and at least two diffusion compartments.

Moreover, it is likewise possible to directly introduce the film-forming gas from the stirring compartment into the film-forming chamber without passing through any diffusion compartment or using a mixing chamber free of any diffusion compartment depending on the required degree of the mixing condition to thus induce the reaction in the film-forming chamber.

The foregoing mixing chamber is effective in, in particular, the MOCVD technique using a raw material, which is a liquid at ordinary temperature. This is because, such a raw material, which is a liquid at ordinary temperature, is heavy even in the vaporized state.

The use of the aforementioned film-forming apparatus permits the formation of an electrode film using, for instance, Pt, Ir and Ru as a raw material and a barrier film such as that comprising a nitride film or an oxide film using, for instance, Ti, Ta and Al as a raw material. Moreover, to further improve the characteristic properties of the resulting thin film, other additives (sources of raw substances) such as La(THD)$_3$, Sr(THD)$_3$, Ca(THD)$_2$ and Al(THD)$_3$ may be used.

Examples and Comparative Examples of the method for forming a metal oxide thin film according to the MOCVD technique using the film-forming apparatus of the present invention will hereunder be described in more detail with reference to the accompanying drawings.

EXAMPLE 1

In this Example, a metal oxide thin film was continuously formed using the film-forming apparatus as shown in FIG. 4 under the conditions specified below. More specifically, this apparatus is provided with a by-pass line 50, which connects the primary and secondary sides of the particle traps 46a, 46b used for preventing any particle from flowing into the film-forming chamber 47. Then gases such as a raw gas, a reactive gas and a carrier gas were passed through the film-forming chamber of the apparatus under desired conditions while the valve V3 of the by-pass line was opened prior to the initiation of the supply of these gases to the film-forming chamber and then the valve was closed to thus initiate the formation of such a film without being accompanied by any temporary and significant pressure change between the primary and secondary sides of the particle traps 46a, 46b and to continuously carry out the film-forming operation.

Figure 9:
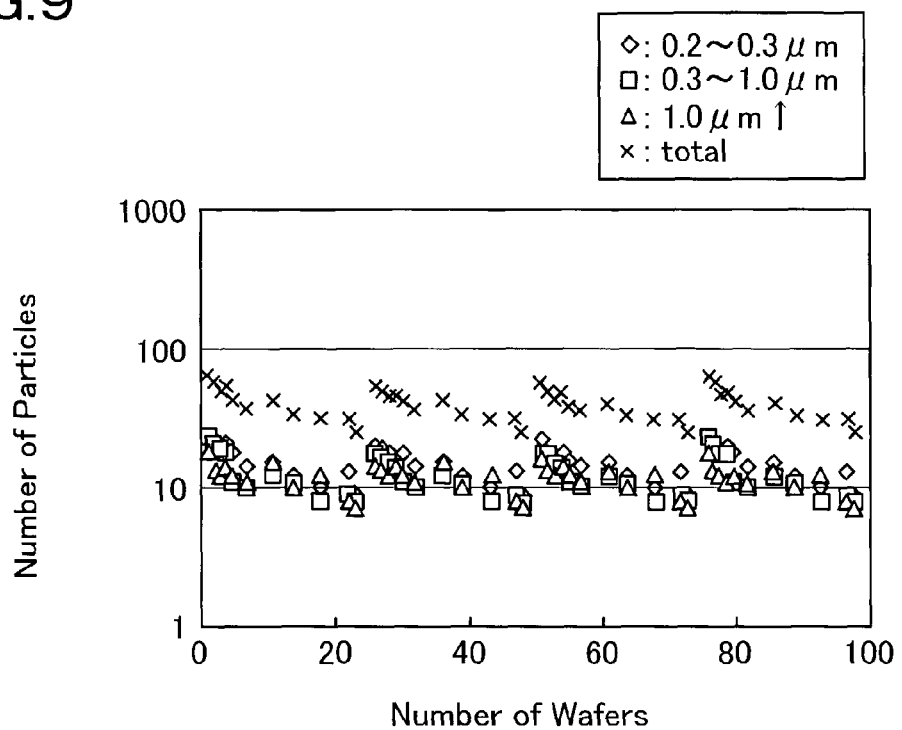
FIG. 9 is a graph showing the behavior of particles observed when continuously forming 100 films according to the procedures used in Example 1.

Film-Forming Apparatus Conditions:
  Temperature of Vaporization Chamber: 250° C.
  Particle Trap 42:
    Dust Collector Type Screen comprising 5 screen plates; and
    Established Temperature: 230° C.
  Particle Trap 46a:
    Sintered Stainless Steel Fiber Filter (absolute filtration diameter: 1 µm); and
    Established Temperature: 240° C.
  Particle Trap 46b:
    Sintered Stainless Steel Fiber Filter (absolute filtration diameter: 0.3 µm); and
    Established Temperature: 240° C.
Film-Forming Conditions for 100 Runs:
  Substrate Temperature: 600° C.; and
  Film-forming pressure: 1000 Pa
  Raw Materials:
    Pb(THD)$_2$/cyclohexane: 0.36 mL/min;
    Zr(DMHD)$_4$/cyclohexane: 0.20 mL/min; and
    Ti(iso-PrO)$_2$ (THD)$_2$ /cyclohexane: 0.22 mL/min
  Flow Rate of Reactive Gas: O$_2$: 1500 sccm
  Film-forming time: 330 sec.
Note: THD: 2,2,6,6-tetramethylhepta-dionate, C$_{11}$H$_{19}$O$_2$; and
  DMHD: 2,6-dimethylhepta-dionate, C$_{10}$H$_{17}$O$_2$ A film was formed under the foregoing conditions and as a result, it was found that the resulting film was a metal oxide thin film having a thickness of 100 nm and a composition: Pb/(Zr+Ti)=1.15, Zr/(Zr+Ti)=0.40. Since the film-forming operation was initiated without any significant temporary pressure change or a pressure difference [(the pressure at the pressure gauge P2)-(the pressure at the pressure gauge P3)] between the primary and secondary sides of the particle traps 46a, 46b, there was not observed any catching up of undesirable particles from the particle traps and any flowing out thereof to the downstream side of the traps and as a result, the total number of particles having a particle size of not less than 0.2 µm observed during the continuous operation could be reduced to a level of not more than 50 as shown in FIG. 9.

Moreover, it was also confirmed that the surface morphology of the resulting thin film was smooth, that the crystallizability thereof was also good and that the step-covering ability with respect to fine three-dimensional structure was excellent.

EXAMPLE 2

In this Example, a variable valve was used as the valve V3 of the by-pass line 50 for connecting the primary and secondary sides of the particle traps 46a, 46b. Then gases such as a raw gas, a reactive gas and a carrier gas were passed through the film-forming chamber of the apparatus under desired conditions while the valve V3 of the by-pass line was opened prior to the initiation of the supply of these gases to the film-forming chamber, the valve was gradually closed and then the formation of such a film was initiated. The initiation of the film-formation was never accompanied by any temporary and significant pressure change between the primary and secondary sides of the particle traps 46a, 46b and the film-forming operation was thus continuously carried out.

Film-Forming Apparatus Conditions:
  Temperature of Vaporization Chamber: 220° C.
  Particle Trap 42:
    Dust Collector Type Screen comprising 5 screen plates (filler: felt-like stainless steel fibers); and
    Established Temperature: 230° C.
  Particle Trap 46a:
    Sintered Stainless Steel Fiber Filter (absolute filtration diameter: 0.3 µm); and
    Established Temperature: 240° C.
  Particle Trap 46b:
    Sintered Stainless Steel Fiber Filter (absolute filtration diameter: 0.3 µm); and
    Established Temperature: 240° C.
Film-Forming Conditions for 100 Runs:
  Substrate Temperature: 600° C. and
  Film-forming pressure: 1000 Pa
  Raw Materials:
    Pb(THD)$_2$/cyclohexane: 0.36 mL/min;
    Zr(DMHD)$_4$/cyclohexane: 0.20 mL/min; and
    Ti(iso-PrO)$_2$ (THD)$_2$/cyclohexane: 0.22 mL/min
  Flow Rate of Reactive Gas: O$_2$: 1500 sccm
  Film-forming time: 330 sec.

Figure 10:
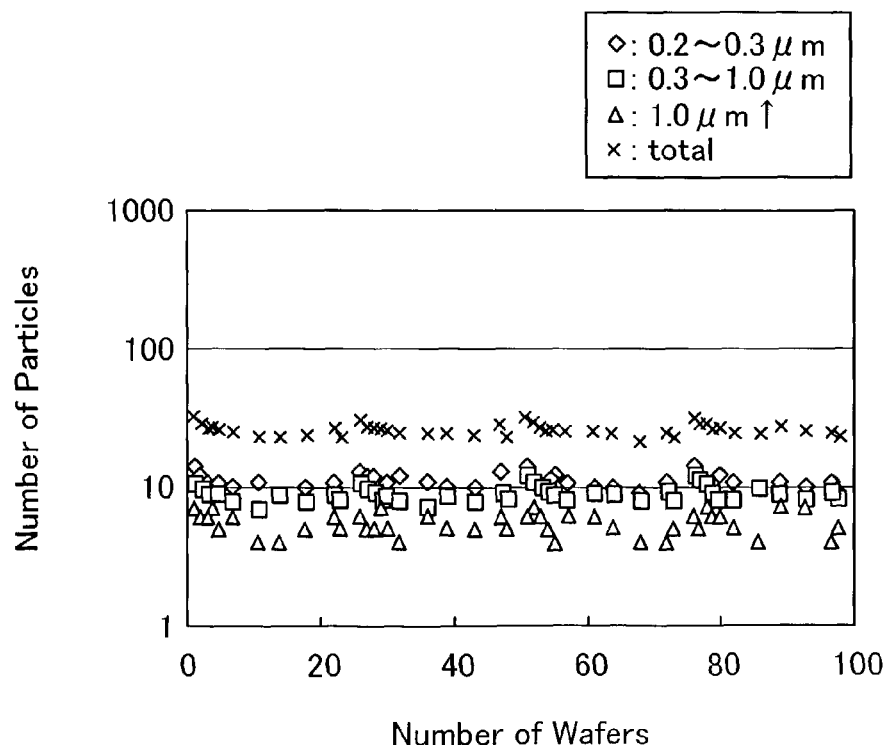
FIG. 10 is a graph showing the behavior of particles observed when continuously forming 100 films according to the procedures used in Example 2.
Figure 11:
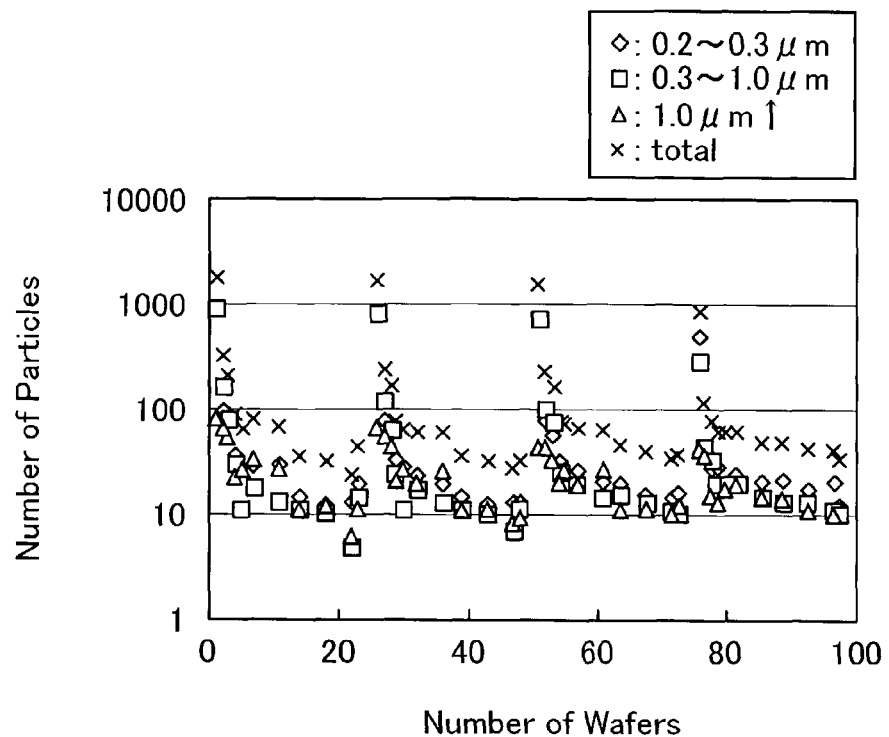
FIG. 11 is a graph showing the behavior of particles observed when continuously forming 100 films according to the procedures used in Example 3.

A film was formed under the foregoing conditions and as a result, it was found that the resulting film was a metal oxide thin film having a thickness of 100 nm, a composition: Pb/(Zr+Ti)=1.15, Zr/(Zr+Ti)=0.40. Since the film-forming operation was initiated without any significant temporary pressure change between the primary and secondary sides of the particle traps 46a, 46b, there was not observed any catching up of undesirable particles from the particle traps and any flowing out thereof to the downstream side of the traps and as a result, the total number of particles having a particle size of not less than 0.2 µm observed during the continuous operation could be reduced to a level of not more than 30 as shown in FIG. 10.

Moreover, it was also confirmed that the surface morphology of the resulting thin film was smooth, that the crystallizability thereof was also good and that the step-covering ability (or step coverage) with respect to fine three-dimensional structure was excellent.

EXAMPLE 3

A metal oxide thin film was continuously formed using a apparatus shown in FIG. 4, which was free of any by-pass line 50 (or a apparatus as shown in FIG. 1) under the same apparatus conditions and film-forming conditions used in Example 1 or 2.

As a result, it was found that the resulting film was a metal oxide thin film having a thickness of 100 nm and a composition: Pb/(Zr+Ti)=1.15, Zr/(Zr+Ti)=0.40. Unlike Examples 1 and 2, a temporary pressure difference was generated between the primary and secondary sides of the particle traps 46a, 46b and accordingly, there was observed catching up of undesirable particles from the particle traps and flowing out thereof to the downstream side of the traps. As a result, there was observed an increase in the number of particles in wafers obtained in the early stage of the production lot and the total number of particles having a particle size of not less than 0.2 μm observed during the continuous operation could not be reduced to a level of not more than 50 as shown in FIG. 10 unlike Examples 1 and 2. However, the total number of particles was smaller than that observed for the conventional film-forming apparatus. Moreover, it was confirmed that the surface morphology of the resulting thin film was not smooth as compared with Examples 1 and 2, but the smoothness thereof was judged to be practically acceptable.

EXAMPLE 4

In this example, PZT thin films were prepared by repeating the same procedures used in Example 1 using the film-forming apparatus shown in FIG. 4, while selecting the following raw gases for PZT as ferroelectric substances and oxygen gas ($O_2$) as a reactive gas. The mixing chamber used in this Example was one as shown in FIG. 5.

| Raw Gas | Conc. (mol/L) | Set Flow Rate (mL/min) |
|---|---|---|
| Pb(THD)$_2$/THF | 0.3 | 0.6 |
| Zr(THD)$_4$/THF | 0.3 | 0.3 |
| Ti(i-PrO)$_2$(THD)$_2$/THF | 0.3 | 0.3 |
| | Carrier Gas | |
| N$_2$ | — | 500 sccm |
| | Reactive Gas | |
| O$_2$ | — | 2000 sccm |

Note:
THF: tetrahydrofuran, $C_4H_8O$;
i-PrO: isopropoxy group.

The pressure in the film-forming chamber was adjusted to 6 Torr. At this stage, the pressure in the diffusion compartment of the mixing chamber was found to be 13 Torr, while that in the region for vaporizing the raw gas was found to be 20 Torr. In general, stable vaporization of a liquid raw material desirably takes place at a pressure of not more than 30 Torr and therefore, the foregoing completely satisfied this requirement.

Figure 12A:
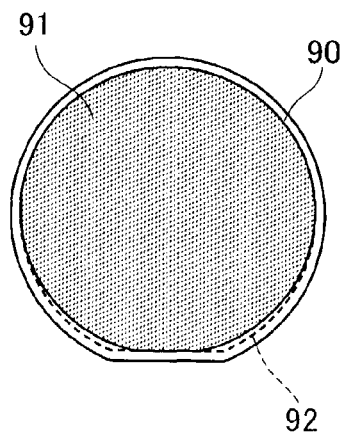
FIGS. 12(a) and 12(b) are top plan views showing substrates on which thin films are formed according to the apparatus of the present invention and the conventional techniques respectively.

The foregoing raw gas and reactive gas were introduced into a mixing chamber 61 provided with a semi-spherical partition plate 64, as shown in FIG. 5, from the gas-introduction ports 65a and 66a through the gas-introduction pipes 65 and 66, respectively to thus stir, mix and diffuse the gases, followed by the introduction of the resulting film-forming gas prepared in the mixing chamber 61 into the film-forming chamber in which a PZT thin film was formed on a substrate according to the MOCVD technique, which was conducted under the usual conditions. At this stage, it was confirmed that the film-forming gas introduced into the film-forming chamber was substantially free of any particle. The thickness distribution of the resulting thin film is roughly depicted on FIG. 12(a). In the figure, the numerical values 90, 91 and 92 represent a substrate, thick film regions and thin film regions, respectively. As will be clear from this figure, the use of a mixing chamber provided therein with a partition plate 64 permitted the continuous formation of a uniform film having good quality on the substrate 90. In this case, the deviation in the film thickness distribution was found to be about ±1.2% and thus, the resulting film completely satisfied such a condition of not more than ±3% required for improving the yield of semiconductor chips from the viewpoint of apparatus manufacture. These results clearly indicate that the use of a desired partition plate 64 permits the efficient convection, stirring, mixing and diffusion of gases in the stirring compartment 62 and the diffusion compartment 63; the formation of a uniform gas mixture comprising a raw gas and a reactive gas; and the formation of a thin film having a uniform thickness.

Figure 12B:
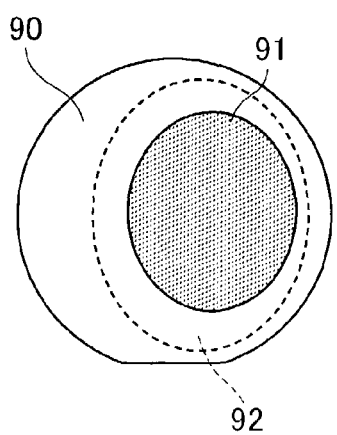

A thin film was formed according to the procedures identical to those used above, except that a conventional mixing chamber provided with the foregoing particle trap, but free of any partition plate was used, the same raw gas and reactive gas were introduced into the mixing chamber, followed by mixing and diffusing the same and the formation of a thin film according to the MOCVD technique. The thickness distribution of the thin film thus prepared is roughly depicted on FIG. 12(b). In this case, thicker film regions 91 formed on a substrate 90 were unevenly distributed on the side of the reactive gas-introduction port, while thinner film regions 92 were unevenly distributed on the raw gas-introduction port. A phenomenon in which regions having a relatively high concentration of each gas were inverted with respect to the positions of the gas-introduction ports took place at the bottom of a space in the mixing chamber (the total space of the stirring and diffusion compartments in the case where a partition plate is fitted to the mixing chamber) and the inversion phenomenon was maintained from the film-forming gas exhaust port to the gas head in a laminar flow state and accordingly, it would be assumed that the concentration distribution was transferred to the substrate. In this case, the deviation in the film thickness distribution was found to be ±6.3%, which was not less than two times that required for the improvement of the yield of semiconductor chips (not more than ±3%) from the viewpoint of the device manufacture and therefore, the resulting film could not be acceptable as a material for device manufacture.

Moreover, the same procedures used above were repeated while Zr(DMHD)$_4$/THF was substituted for Zr(THD)$_4$/THF as the foregoing raw gas for PZT and a raw gas and a reactive gas for BST was used. In any case, both the film quality and the thickness distribution of the resulting thin film had the same tendency observed for the foregoing films or there could efficiently and continuously be prepared a thin film having uniform thickness distribution using a film-forming gas free of undesirable particles. The thickness distribution completely satisfied such a condition of not more than ±3%.

EXAMPLE 5

In this Example, a PZT thin film was formed on the surface of a substrate for electrode having a diameter of 8 inches using the film-forming apparatus shown in FIG. 4 like Example 1 and selecting raw materials for PZT as ferroelectric materials whose concentrations and flow rates were specified below and oxygen gas ($O_2$) as a reactive gas. In this case, the film-forming chamber used was one as shown in FIG. 7. In this connection, the pressure in the film-forming chamber was maintained at 5 Torr using a pressure-control valve.

| Raw Gas | Conc. (mol/L) | Set Flow Rate (mL/min) |
|---|---|---|
| Pb(THD)$_2$/THF | 0.3 | 1.14 |
| Zr(DMHD)$_4$/THF | 0.3 | 0.58 |
| Ti(i-PrO)$_2$(THD)$_2$/THF | 0.3 | 0.67 |
| Carrier Gas | | |
| N$_2$ | — | 500 sccm |
| Reactive Gas | | |
| O$_2$ | — | 2500 sccm |
| Inert Gas | | |
| N$_2$ | | 0 to 4000 sccm |

The results thus obtained will be explained below.

Figure 13:
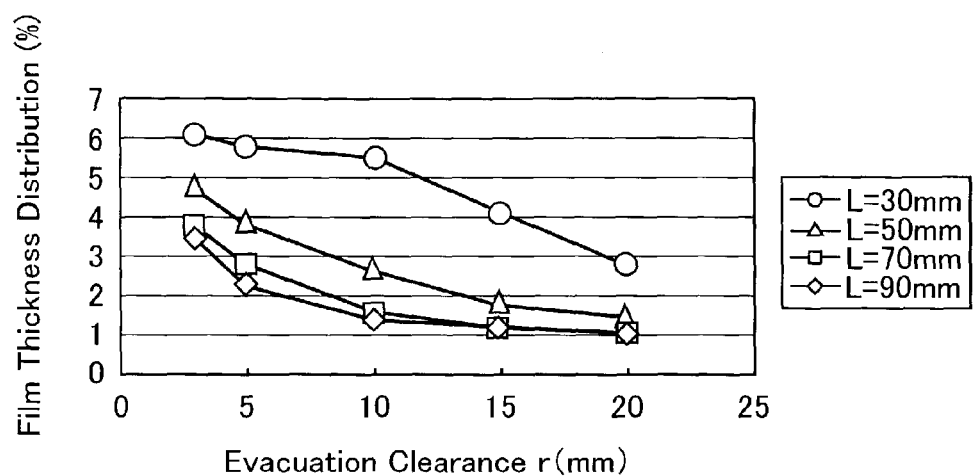
FIG. 13 is a graph showing the film thickness distributions observed when PZT films are formed while variously changing the gap r and the height or position L in the film-forming chamber shown in FIG. 7.
Figure 14:
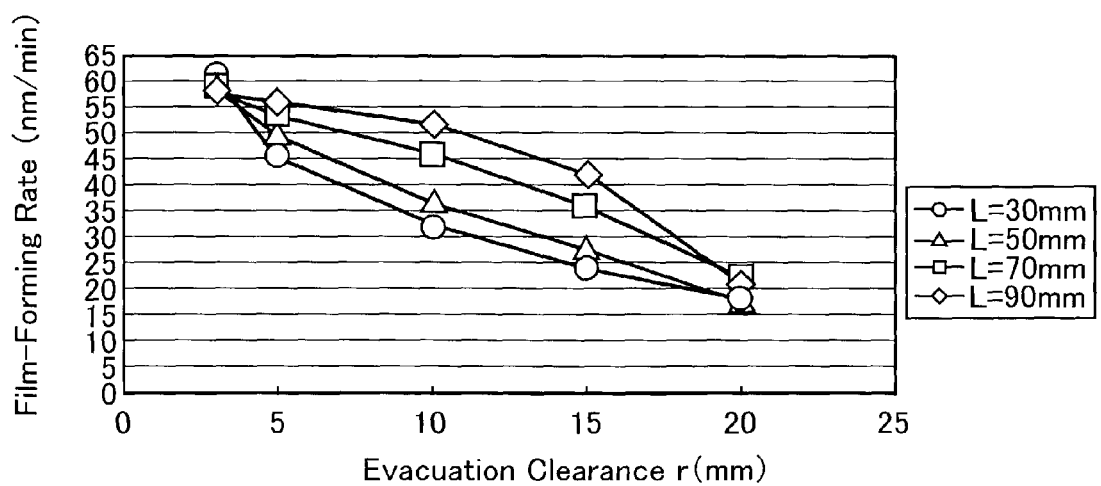
FIG. 14 is a graph showing the film-forming rate observed at the center of the substrate and observed when PZT films are formed while variously changing the gap r and the height or position L in the film-forming chamber shown in FIG. 7.

FIG. 13 shows the film thickness distribution (%) observed when a PZT film having a thickness of 100 nm was prepared while changing the size of the interstice (the size of the exhaust port) "r" (evacuation clearance r (mm)) formed between the inner wall surface of the film-forming chamber 71, as shown in FIG. 7, and the sleeve member 83 and the height L (mm) of the sleeve member. On the other hand, FIG. 14 shows the film-forming rates (nm/min) at the center of the substrate observed when forming PZT films while changing the interstice r and the height L.

To maintain the film thickness distribution within 2%, the interstice r should be set at a level of not less than 10 mm when the height L is not less than 70 mm. On the other hand, the film-forming time is desirably not more than 3 minutes while taking into consideration the mass production ability and therefore, the film-forming rate should be controlled to not less than 35 nm/min when forming a thin film having a film thickness of 100 nm. Accordingly, the measured results shown in FIG. 14 indicate that good film thickness distribution and the film-forming rate suitable for the mass production can be obtained if the size r of the interstice is set at a level of not less than 10 mm and preferably 10 to 17 mm; and the height L of the sleeve member is set at a level of not less than 70 mm.

Figure 15:
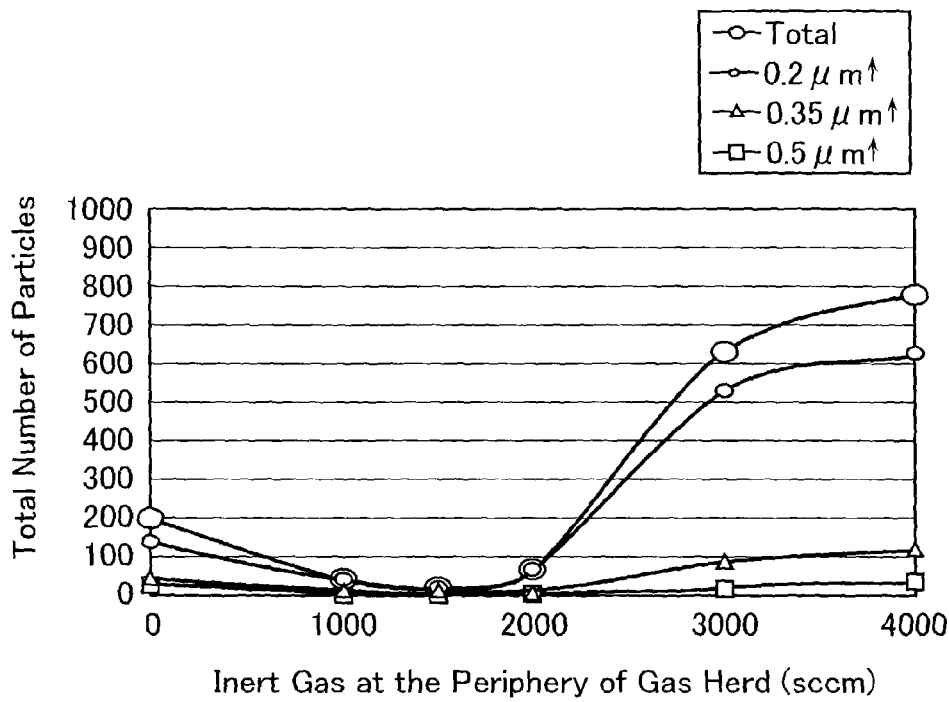
FIG. 15 is a graph showing the relation between the film thickness distribution and the dust associated with the film-formation observed when a PZT film is formed on a substrate while changing the flow rate of an inert gas injected through the gas ring in the film-forming chamber as shown in FIG. 7.

Then the size of the interstice r was set at 15 mm and the height L of the sleeve member was set at 70 mm, among the foregoing conditions and an inert gas N$_2$, which did not contribute to the film-forming process was introduced into the film-forming chamber 71 through the gas ring 84 to thus determine the film thickness distribution and dust generated during the film-forming process. FIG. 15 shows the relation between the film thickness distribution and the film-forming dust (total number of particles) observed when a PZT film was formed on an electrode substrate having a diameter of 8 inches, while changing the flow rate of the inert gas around the gas head within the range of from 0 to 4000 sccm. The data plotted on FIG. 15 indicate that the number of particles was minimized when the flow rate of the inert gas introduced into the film-forming chamber through the gas ring 84 ranged from 1000 to 2000 sccm. This clearly indicates that the use of inert gas is effective as compared with the case in which any inert gas is not used.

Figure 16:
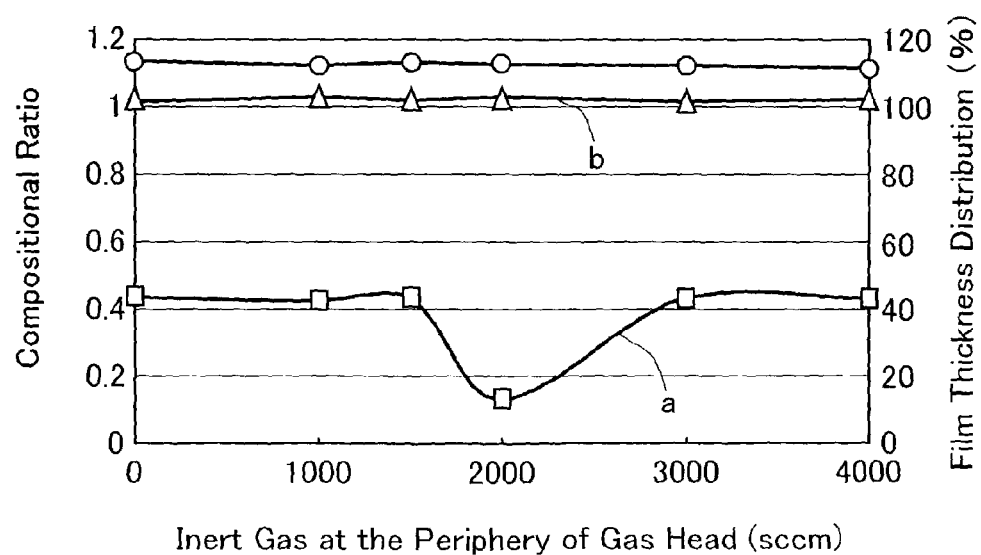
FIG. 16 is a graph showing the distribution of the film composition and the film thickness distribution observed when a PZT film is formed on a substrate while changing the flow rate of an inert gas injected through the gas ring and introducing the same into the film-forming chamber as shown in FIG. 7.

FIG. 16 shows the compositional ratio (line a) and the film thickness distribution (line b) observed when the size of the interstice r was set at 15 mm and the height of the sleeve member L was set at 70 mm like the foregoing case and an inert gas N$_2$ was introduced into the film-forming chamber 71 through the gas ring 84, while changing the flow rate thereof within the range of from 0 to 4000 sccm to thus form or deposit PZT films on an electrode substrate having a diameter of 8 inches. The data shown in FIG. 16 indicate that there was not observed any change in the film thickness distribution even when changing the flow rate of the inert gas, but the compositional ratio went out of order in the proximity to the flow rate of the inert gas of 2000 sccm. In this connection, the term "compositional ratio" herein used means the ratio: Zr/(Zr+Ti).

The foregoing measured results plotted on FIGS. 13 to 16 clearly indicate that in the film-forming apparatus as shown in FIG. 7, the inert gas per se introduced into the film-forming chamber through the gas ring 84 never became a cause of any turbulent flow and/or convection flow and the inert gas showed the highest possible rectifying action if the size of the interstice r was set at a level of not less than 10 mm and preferably 10 to 17 mm, the height L of the sleeve member 83 was set at a level of not less than 70 mm and the flow rate of the inert gas introduced into the film-forming chamber from the gas ring 84 was controlled to the range of from 1000 to 1500 sccm. As a result, this film-forming apparatus permitted the achievement of excellent and stable thickness distribution (not more than 2%), compositional ratio, compositional distribution and film-forming rate of the resulting thin film, the considerable reduction of the dust generated during the film-forming process (the number of particles having a particle size of not less than 0.2 μm is not more than 20) and the continuous film-forming procedures.

According to the present invention, at least one specific particle trap is disposed between a vaporization chamber and a mixing chamber and at least one specific particle trap is disposed on the downstream side of the mixing chamber and in particular, an inertial dust collector type screen is disposed between the vaporization device and the mixing chamber and a filter is disposed on the downstream side of the mixing chamber and in the proximity to the gas head, in order to remove particles present in a raw gas. Thus, particles present in raw gases and in its turn a mixed gas (film-forming gas) can effectively be removed and therefore, there can be provided a film-forming apparatus capable of forming a thin film having good quality.

Moreover, the apparatus comprises a by-pass line connecting the primary and secondary sides of the particle trap arranged within the mixing chamber. This permits the substantial removal of particles present in raw gases and other gases introduced into the film-forming chamber and in its turn the film-forming gas and this also permits the prevention of any catching up and flowing out of such particles from the particle trap due to the pressure change encountered when the apparatus is operated and as a result, a film-forming apparatus can be provided, which permits the preparation of a thin film having good quality.

In addition, when forming a film using the foregoing apparatus, gases such as raw gases are passed through the apparatus, while opening the valve on the by-pass line for connecting the primary and secondary sides of the particle trap arranged on the downstream side of the mixing chamber and then the valve is closed and the film-forming operation is initiated. Thus, the film-forming operation can be initiated without generating any temporary significant pressure difference between the primary and secondary sides of the particle trap. Accordingly, this method permits the prevention of any catching up and flowing out of such particles from the particle trap due to the pressure change encountered when the apparatus is operated. Further, a variable valve is substituted for the valve, gases are initially passed through the apparatus while opening the valve and then the gases are passed through the apparatus while adjusting the variable valve to thus initiate the film-forming operation without generating any temporary significant pressure difference between the primary and secondary sides of the particle trap and to further control the generation of particles.

What is claimed is:

1. A film-forming apparatus, which comprises:
    a film-forming chamber as a vacuum chamber equipped with a stage for placing and supporting a substrate in an interior thereof,
    a mixing chamber for forming a mixed gas comprising a raw gas and a reactive gas and connected to said film-forming chamber, wherein said mixing chamber is provided directly on an upper surface of said film-forming chamber and is provided separately and distinctly with a first pipe for introducing said raw gas therein and a second pipe for introducing said reactive gas therein,
    a vaporization chamber for vaporizing a raw material, and
    a gas head for introducing said mixed gas into said film-forming chamber, said gas head being disposed directly between said mixing chamber and said film-forming chamber opposite to said stage,
    wherein said gas head spans an opening defined at a bottom of said mixing chamber, seals said mixing chamber, is directly attached to said mixing chamber, and is located on the upper surface of said film-forming chamber,
    wherein particle traps whose temperature can be controlled are disposed and positioned between said vaporization chamber and said mixing chamber and within said mixing chamber on a downstream side of said mixing chamber, respectively,
    wherein introduction ports of said first pipe and said second pipe oppose each other in said mixing chamber and lie on a common line extending between a center axis of each introduction port and connecting said gas introduction ports, and said raw gas flowing from said first pipe collides and mixes with said reactive gas flowing from said second pipe,
    wherein said stage is enclosed with a cylinder-shaped sleeve member having a predetermined length,
    wherein said mixing chamber includes a stirring compartment equipped with said first and second pipes penetrating an upper wall of said stirring compartment and a diffusion compartment for diffusing said mixed gas,
    wherein a partition plate provided with a gas blow-off port is disposed between said stirring compartment and said diffusion compartment such that a volume of said diffusion compartment is larger than that of said stirring compartment, said first and second pipes penetrating said upper wall of said stirring compartment at positions directly opposing a central portion of said partition plate, and
    wherein said gas blow-off port is provided at a desired position below the line connecting said gas introduction ports and at the rear of one of said gas introduction ports.

2. The film-forming apparatus as set forth in claim 1, wherein said particle trap disposed between said vaporization chamber and mixing chamber consists of an inertial dust collector type screen and said particle trap disposed on the downstream side of said mixing chamber consists of a porous filter.

3. The film-forming apparatus as set forth in claim 2, wherein said inertial dust collector type screen comprises a mesh-like dust collecting screen plate having a plurality of through holes arranged in the same direction for introducing a gas into said mixing chamber at an angle of inclination of about 45 degrees and if this inertial dust collector type screen comprises a plurality of mesh-like dust collecting screen plates put in layers, these screen plates are arranged in such a manner that angles of inclination of the through holes of neighboring two screen plates make an angle of 90 degrees.

4. The film-forming apparatus as set forth in claim 3, wherein a dust collection screen plate constituting said inertial dust collector type screen is one whose space is charged with a filler selected from the group consisting of metals, ceramics and quartz.

5. The film-forming apparatus as set forth in claim 2, wherein the porous filter is a sintered metal filter.

6. The film-forming apparatus as set forth in claim 1, wherein said mixing chamber comprises a stirring compartment equipped with a pipe for introducing said raw gas into said mixing chamber and a pipe for introducing said reactive gas therein and a diffusion compartment for diffusing a mixed gas obtained by stirring and admixing said raw gas and said reactive gas; said pipes for introducing said raw gas and said reactive gas respectively are arranged in such a manner that gas introduction ports of these pipes are opposed to one another; a partition plate is disposed between said stirring compartment and said diffusion compartment such that a volume of said diffusion compartment is larger than that of said stirring compartment; said partition plate is provided with a gas blow-off port at a desired position below a straight line connecting said gas introduction ports; and said mixed gas undergoes diffusion from said stirring compartment to said diffusion compartment through said gas blow-off port.

7. The film-forming apparatus as set forth in claim 6, wherein said partition plate is one having a convex quadratic curved shape with respect to a bottom of said mixing chamber.

8. The film-forming apparatus as set forth in claim 6 or 7, wherein said gas blow-off port is disposed at a position corresponding to a half of a vertical distance between a periphery and a bottom of said partition plate.

9. The film-forming apparatus as set forth in claim 1, wherein said stage for placing and supporting the substrate is enclosed with a cylinder-shaped sleeve member having a desired length so that an exhaust gas is discharged from a first space defined by said gas head and said stage to a second space below said stage through a gap between said sleeve member and an inner wall of said film-forming chamber without generating any convection current and a height of said stage is set at such a level that a volume of said second space connected to a vacuum exhaust means is larger than that of said first space.

10. The film-forming apparatus as set forth in claim 9, wherein said apparatus further comprises a gas ring, which permits a uniform introduction of an inert gas into said film-forming chamber along the inner wall of said film-forming chamber and which is disposed on a top face of said film-forming chamber.

11. The film-forming apparatus as set forth in claim 9 or 10, wherein said gap between said sleeve member and said inner wall of said film-forming chamber is set at a level of not less than 10 mm and a height or position at which said sleeve member is disposed is set at a level of not less than 70 mm.

12. The film-forming apparatus as set forth in claim 1, wherein said apparatus further comprises a by-pass line equipped with a valve, which connects a top of said mixing chamber corresponding to a primary side of said particle trap disposed within said mixing chamber and on the downstream side thereof to a bottom of said film-forming chamber corresponding to a secondary side thereof.

13. The film-forming apparatus as set forth in claim 1, wherein said apparatus comprises a plurality of particle traps disposed within said mixing chamber and on the downstream side of said mixing chamber and a by-pass line equipped with a valve, which connects a bottom of said film-forming chamber corresponding to a secondary side of said particle trap nearest to said film-forming chamber to a primary side of the particle trap positioned at an upstream.

14. The film-forming apparatus as set forth in claim 12 or 13, wherein said valve is a variable valve.

15. The film-forming apparatus as set forth in claim 1, further comprising a plurality of particle traps disposed within said mixing chamber and on the downstream side of said mixing chamber, and a by-pass line equipped with a valve which connects an upstream side corresponding to a primary side of said particle trap nearest to said film-forming chamber to a bottom of said film-forming chamber.

* * * * *